United States Patent
Di Vincenzo et al.

(10) Patent No.: US 10,446,214 B1
(45) Date of Patent: Oct. 15, 2019

(54) SENSE AMPLIFIER WITH SPLIT CAPACITORS

(71) Applicant: Micron Technology, Inc., Boise, ID (US)

(72) Inventors: Umberto Di Vincenzo, Capriate San Gervasio (IT); Ferdinando Bedeschi, Biassono (IT); Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/102,053

(22) Filed: Aug. 13, 2018

(51) Int. Cl.
*G11C 11/22* (2006.01)

(52) U.S. Cl.
CPC ........ *G11C 11/2273* (2013.01); *G11C 11/221* (2013.01)

(58) Field of Classification Search
CPC .......................... G11C 11/2273; G11C 11/221
See application file for complete search history.

(56) References Cited

U.S. PATENT DOCUMENTS

| | | | |
|---|---|---|---|
| 6,459,609 B1* | 10/2002 | Du | G11C 11/22 365/145 |
| 10,192,606 B2* | 1/2019 | Vimercati | G11C 11/221 |
| 2006/0221734 A1* | 10/2006 | Bedeschi | G11C 7/062 365/201 |
| 2017/0062036 A1* | 3/2017 | Glazewski | G11C 11/2273 |
| 2018/0308538 A1* | 10/2018 | Vo | A47C 13/005 |

* cited by examiner

*Primary Examiner* — Khamdan N. Alrobaie
(74) *Attorney, Agent, or Firm* — Holland & Hart LLP

(57) ABSTRACT

Methods and devices for reading a memory cell using a sense amplifier with split capacitors is described. The sense amplifier may include a first capacitor and a second capacitor that may be configured to provide a larger capacitance during certain portions of a read operation and a lower capacitance during other portions of the read operation. In some cases, the first capacitor and the second capacitor are configured to be coupled in parallel between a signal node and a voltage source during a first portion of the read operation to provide a higher capacitance. The first capacitor may be decoupled from the second capacitor during a second portion of the read operation to provide a lower capacitance during the second portion.

35 Claims, 14 Drawing Sheets

SENSE AMPLIFIER WITH SPLIT CAPACITORS

BACKGROUND

The following relates generally to operating a memory array and more specifically to techniques for reading a memory cell using a sense amplifier with split capacitors.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

In general, memory devices may be improved by increasing memory cell density, increasing read/write speeds, increasing reliability, increasing data retention, reducing power consumption, or reducing manufacturing costs, among other metrics. In some cases, a read operation of an FeRAM memory cell may include integrating a charge from the memory cell on an amplifier capacitor to determine a value stored on the memory cell. The amplifier capacitor may, in some cases, be used for additional purposes during the read operation.

DETAILED DESCRIPTION

Figure 1:
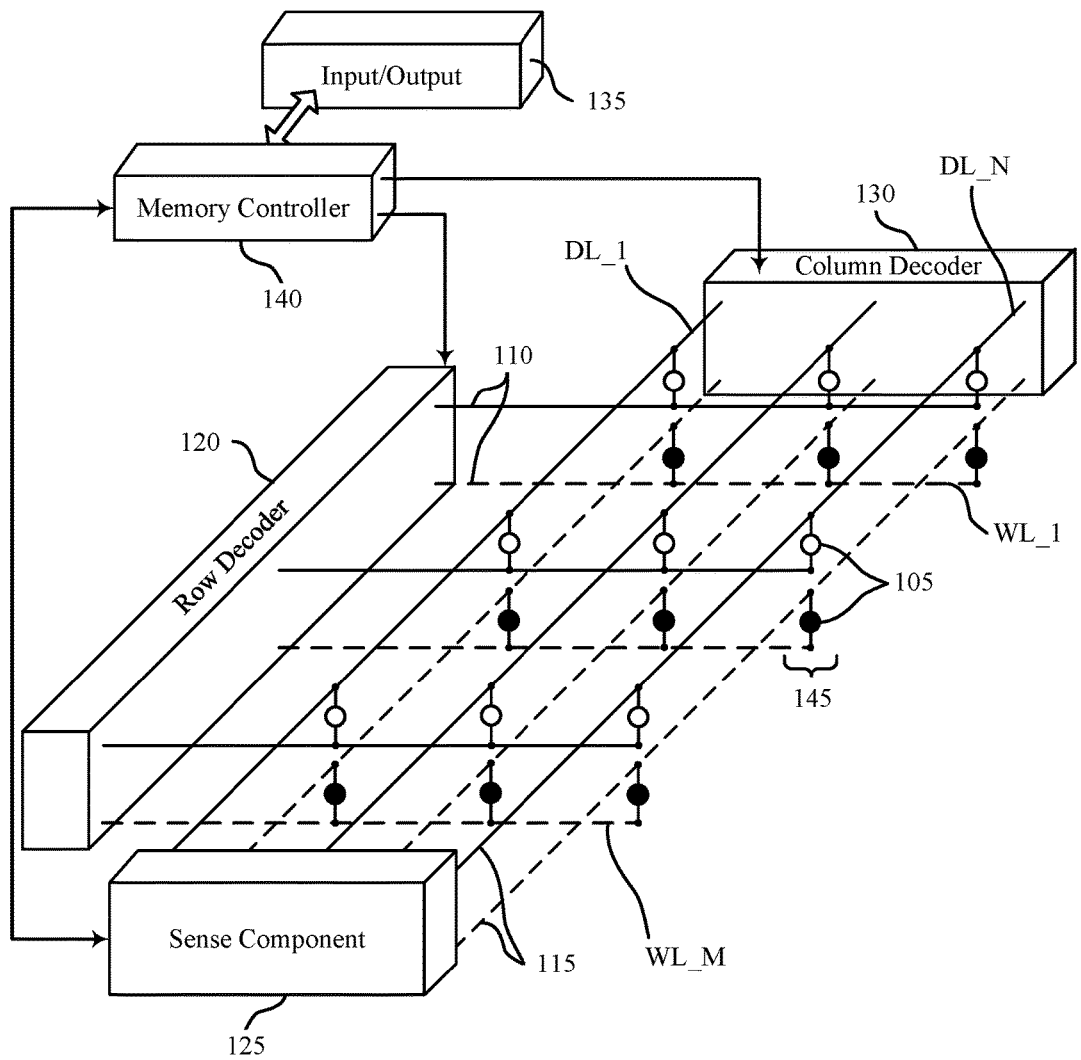
FIG. 1 illustrates an example of a memory array that supports techniques for reading a memory cell using a sense amplifier with split capacitors in accordance with aspects of the present disclosure.

Ferroelectric memory cells include a capacitor that may store the value of the memory cell. Reading the value of the memory cell may involve coupling a digit line to the memory cell and transferring charge between the memory cell capacitor and the digit line, and using a sense component to "sense," or determine, the value of the memory cell based on the resulting voltage of the digit line.

The sense component of a ferroelectric memory device may include a capacitor, such as an amplifier capacitor, that may be used for sensing the value of the cell. Electric charge may be transferred between the amplifier capacitor and the memory cell via the digit line during a read operation. The amount of charge that is transferred between the amplifier capacitor and the memory cell may reflect the logic value stored on the memory cell (e.g., whether the value is a "0" or a "1," for example). The amplifier capacitor may be charged to an initial known voltage before the read operation, and the change in the amplifier capacitor voltage during the read operation (due to the transferred electric charge) may be used to sense the value of the memory cell. The sense component may compare the voltage across the amplifier capacitor (which may serve as a proxy for the voltage on the digit line) with a reference voltage to determine the value of the memory cell. For example, the value stored on the memory cell may be determined based on whether the voltage at a node of the amplifier capacitor is higher than the reference voltage or lower than the reference voltage, with the difference between these high and low voltages sometimes referred to as a sense window. A larger sense window may be desirable because it may enable more accurate read operations.

In some cases, the amplifier capacitor may be coupled with a signal node rather than coupled directly with the digit line. The signal node may be selectively coupled with the digit line during the read operation, and the value of the memory cell may be determined based on the voltage at the signal node (which may, in turn, be based on the voltage across the amplifier capacitor). Such an approach may allow the voltage of the signal node to be adjusted up or down independently of the digit line. For example, the voltage of the signal node may be shifted down at the end of a read operation to enable the use of a low-voltage latch.

In some cases, the voltage of the signal node may be "boosted" (e.g., increased) at the beginning of the read operation, prior to coupling the digit line with the signal node. Such a boost may increase the efficiency or accuracy of the read operation. The voltage boost may be implemented by coupling the amplifier capacitor between the signal node and a voltage source and increasing the voltage of the voltage source. In some cases, it may be beneficial to use a large amplifier capacitor (in terms of capacitance) for this boost operation to reduce the impact of the parasitic capacitance associated with the memory circuit and provide a faster, more efficient boosting operation.

The size of the amplifier capacitor may affect the quality or performance of the read operation in other ways. For example, although the total amount of charge transferred between the memory cell and the amplifier capacitor depends on the initial value stored on the memory cell, there is some amount of charge that is initially transferred at the beginning of a read operation that is the same regardless of the value stored on the memory cell. This charge may be referred to as the "displacement charge" or "common mode charge" and may be a charge associated with increasing a bias voltage across the memory cell (e.g., across the ferroelectric capacitor in the cell). The displacement charge may not be useful for the read operation because it may be the same regardless of the value stored on the memory cell. In some cases, the displacement charge may be relatively large compared with what may be referred to as the "polar charge" that represents the value stored on the memory cell. The polar charge may be a charge that remains stored on the memory cell after a write operation when the bias voltage across the cell decreases to essentially zero and may represent the value stored on the cell. Because the displacement charge is larger than the polar charge, once all the charge (the displacement charge and the polar charge) is integrated on the amplifier capacitor during the read operation, there may be a relatively small difference between a voltage representing a "1" value and a voltage representing a "0" value (e.g., a small sense window). This may lead to less reliable read operations.

A small amplifier capacitor may provide better fidelity for the polar charge and therefore provide a larger sense window but may become saturated by the larger initial displacement charge. A larger amplifier capacitor may provide an efficient boost operation and accommodate a large displacement charge amount but may lead to a relatively small sense window. In some examples, a sense amplifier as described herein may utilize split capacitors (e.g., multiple separate capacitors) rather than a single amplifier capacitor, which may provide certain benefits in view of this tradeoff.

Features of the disclosure introduced above are further described below in the context of FIGS. 1 through 3. Specific examples and benefits are then described with respect to FIGS. 4 through 10. These and other features of the disclosure are further illustrated by and described with reference to apparatus diagrams, system diagrams, and flow-charts that relate to techniques for reading a memory cell using a sense amplifier with split capacitors. Although the discussion herein primarily focuses on ferroelectric memory cells, similar techniques may be used for other types of memory cells, such as DRAM or other types of memory cells, without departing from the scope of the disclosure.

FIG. 1 illustrates an example of a memory array 100 that supports techniques for reading a memory cell using a sense amplifier with split capacitors in accordance with aspects of the present disclosure. FIG. 1 is an illustrative schematic representation of various components and features of the memory array 100. As such, it should be appreciated that the components and features of the memory array 100 are shown to illustrate functional interrelationships, not their actual physical positions within the memory array 100. Memory array 100 may also be referred to as an electronic memory apparatus or device. Memory array 100 includes memory cells 105 that are programmable to store different states. In some cases, each memory cell 105 may be a ferroelectric memory cell that may include a capacitor with a ferroelectric material as the insulating material. In some cases, each memory cell 105 may be programmable to store one of two states, denoted as a logic 0 and a logic 1. Each memory cell 105 may be stacked on top of each other resulting in two decks of memory cells 145. Hence, the example in FIG. 1 may be an example that depicts two decks of memory array.

In some cases, memory cells 105 are configured to store one of more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with paraelectric or linear polarization properties as the insulator. By contrast, a ferroelectric memory cell may include a capacitor with a ferroelectric material as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing, which may be referred to as access operations, may be performed on memory cells 105 by activating or selecting word line 110 and digit line 115. Word lines 110 may also be known as row lines, sense lines, and access lines. Digit lines 115 may also be known as bit lines, column lines, and access lines. References to word lines and digit lines, or their analogues, are interchangeable without loss of understanding or operation. Word lines 110 and digit lines 115 may be perpendicular (or nearly perpendicular) to one another to create an array. Depending on the type of memory cell (e.g., FeRAM, RRAM), other access lines may be present (not shown), such as plate lines, for example. It should be appreciated that the exact operation of the memory device may be altered based on the type of memory cell and/or the specific access lines used in the memory device.

Asserting (e.g., activating or selecting) a word line 110 or a digit line 115 may include applying a voltage to the respective line. Word lines 110 and digit lines 115 may be made of conductive materials such as metals (e.g., copper (Cu), aluminum (Al), gold (Au), tungsten (W)), metal alloys, carbon, conductively-doped semiconductors, or other conductive materials, alloys, compounds, or the like.

Memory array 100 may be a two-dimensional (2D) memory array or a three-dimensional (3D) memory array. A 3D memory array may include 2D memory arrays formed on top of one another. This may increase the number of memory cells that may be placed or created on a single die or substrate as compared with 2D arrays, which in turn may reduce production costs or increase the performance of the memory array, or both. Memory array 100 may include any number of levels. Each level may be aligned or positioned so that memory cells 105 may be approximately aligned with one another across each level. Each row of memory cells 105 may be connected to a single word line 110, and each column of memory cells 105 may be connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selector device. The word line 110 may be connected to and may control the selector device. For example, the selector device may be a transistor (e.g., thin-film transistor (TFT)) and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. In addition, as described below in FIG. 2, access operation of ferroelectric memory cells may need an additional connection to a node of the ferroelectric memory cell, namely a cell plate node via a plate line.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed. In addition, an access operation of ferroelectric memory cells may need to activate a corresponding plate line for the memory cell 105, associated with plate line decoder (not shown).

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors, capacitors, and amplifiers in order to detect and amplify a difference in the signals. The detected logic state of memory cell 105 may then be output through column decoder 130 as output 135.

In some cases, sense component 125 may be part of a column decoder 130 or row decoder 120. Or, sense component 125 may be connected to or in electronic communication with column decoder 130 or row decoder 120. In some cases, sense component 125 may include a latch to latch the value of the memory cell (e.g., based on the detected logic state).

In some examples, the sense component 125 may include split capacitors that may be coupled with a selected digit line 115 to cause a transfer of electric charge between the split capacitors and memory cell 105 during a read operation of the memory cell. The amount of charge transferred between memory cell 105 and one or both of the split capacitors may correspond to a logic state of the memory cell 105 (e.g., a logic state of 1 or 0). Thus, one or both of the split capacitors may be used to detect a signal from the memory cell 105 during the read operation, since the voltage remaining on one or both of the split capacitors after some amount of electric charge has been transferred between the amplifier capacitor and memory cell 105 is indicative of the logic state of memory cell 105.

A memory cell 105 may be set, or written, by similarly activating the relevant word line 110 and digit line 115—e.g., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So, the logic state may be re-written after a sense operation. Additionally, activating a single word line 110 may result in the discharge of all memory cells in the row; thus, several or all memory cells 105 in the row may need to be re-written.

In some memory architectures, including DRAM, memory cells may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115.

Memory controller 140 may also generate and control various voltages or currents used during the operation of memory array 100.

In some examples, the memory controller 140 may control various phases of a read operation. In some cases, the memory controller 140 may control selection of a memory cell by activating a word line signal. In some cases, the memory controller 140 may control various timings associated with coupling one or both of the split capacitors with a signal node and/or a voltage source by activating one or more control signals.

In general, the amplitude, shape, or duration of an applied voltage or current discussed herein may be adjusted or varied and may be different for the various operations discussed in operating memory array 100. Further, one, multiple, or all memory cells 105 within memory array 100 may be accessed simultaneously; for example, multiple or all cells of memory array 100 may be accessed simultaneously during an access (or write or program) operation in which all memory cells 105, or a group of memory cells 105, are set or reset to a single logic state. It should be appreciated that the exact operation of the memory device may be altered based on the type of memory cell and/or the specific access lines used in the memory device. In some examples where other access lines e.g., plate lines, may be present (not shown), a corresponding plate line that is connected with a word line and a digit line may need to be activated to access a certain memory cell 105 of the memory array. It should be appreciated that the exact operation of the memory device may vary based on the type of memory cell and/or the specific access lines used in the memory device.

Figure 2:
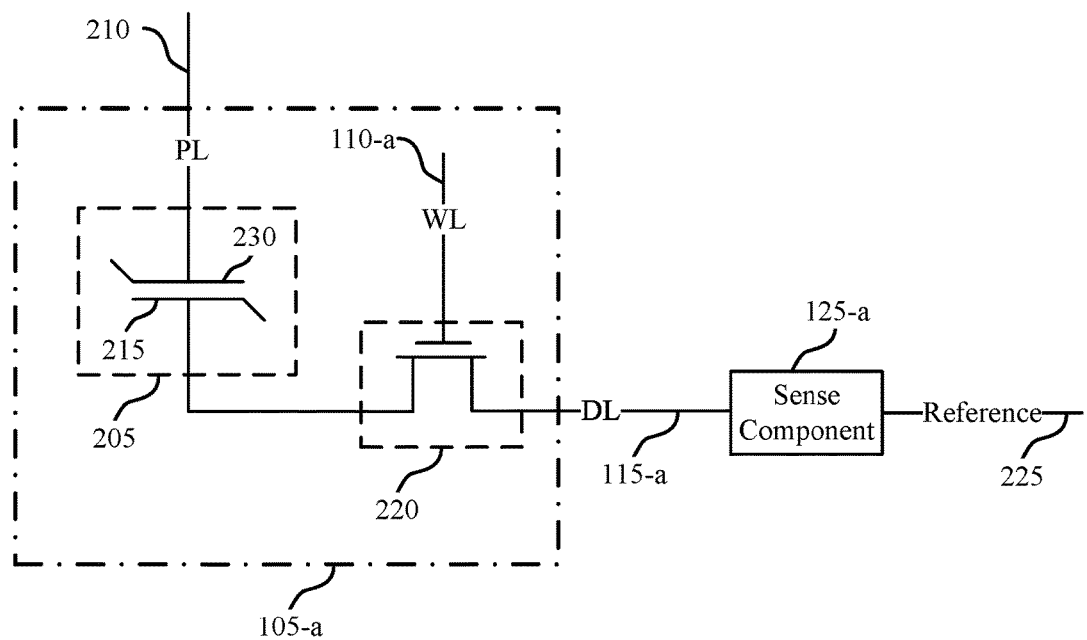
FIG. 2 illustrates an example of a circuit that supports techniques for reading a memory cell using a sense amplifier with split capacitors in accordance with aspects of the present disclosure.

FIG. 2 illustrates an exemplary diagram 200 of a ferroelectric memory cell and circuit components that support techniques for reading a memory cell using a sense amplifier with split capacitors in accordance with aspects of the present disclosure. Circuit 200 includes a memory cell 105-*a*, word line 110-*a*, digit line 115-*a*, and sense component 125-*a*, which may be examples of a memory cell 105, word line 110, digit line 115, and sense component 125, respectively, as described with reference to FIG. 1. Memory cell 105-*a* may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-*a*. Circuit 200 also includes selector device 220 and reference line 225. Cell plate 230 may be accessed via plate line 210 and cell bottom 215 may be accessed via digit line 115-*a*. As described above, various states may be stored by charging or discharging the capacitor 205.

The stored state of capacitor 205 may be read or sensed by operating various elements represented in circuit 200. Capacitor 205 may be in electronic communication with digit line 115-*a*. For example, capacitor 205 can be isolated from digit line 115-*a* when selector device 220 is deactivated, and capacitor 205 can be connected to digit line 115-*a* when selector device 220 is activated. Activating selector device 220 may be referred to as selecting memory cell 105-*a*. In some cases, selector device 220 is a transistor (e.g., thin-film transistor (TFT)) and its operation is controlled by applying a voltage to the transistor gate, where the voltage magnitude is greater than the threshold voltage magnitude of the transistor. Word line 110-*a* may activate the selector device 220; for example, a voltage applied to word line 110-*a* is applied to the transistor gate, connecting the capacitor 205 with digit line 115-*a*.

In other examples, the positions of selector device 220 and capacitor 205 may be switched, such that selector device 220 is connected between plate line 210 and cell plate 230 and such that capacitor 205 is between digit line 115-*a* and the other terminal of selector device 220. In such examples, selector device 220 may remain in electronic communication with digit line 115-*a* through capacitor 205. This configuration may be associated with alternative timing and biasing for read and write operations.

Due to the ferroelectric material between the plates of ferroelectric capacitor 205, and as discussed in more detail below, ferroelectric capacitor 205 may not discharge upon connection to digit line 115-*a*. In one scheme, to sense the logic state stored by ferroelectric capacitor 205, word line 110-*a* may be biased to select memory cell 105-*a* and a voltage may be applied to plate line 210. In some cases, digit line 115-*a* is virtually grounded and then isolated from the virtual ground, which may be referred to as "floating," prior to biasing the plate line 210 and word line 110-*a*.

Biasing the plate line 210 may result in a voltage difference (e.g., plate line 210 voltage minus digit line 115-*a* voltage) across ferroelectric capacitor 205. The voltage difference may yield a change in the stored charge on ferroelectric capacitor 205, where the magnitude of the change in stored charge may depend on the initial state of ferroelectric capacitor 205—e.g., whether the initial state stored a logic 1 or a logic 0. This may cause a change in the voltage of digit line 115-*a* based on the charge stored on ferroelectric capacitor 205. Operation of memory cell 105-*a* by varying the voltage to cell plate 230 may be referred to as "moving the cell plate."

The change in voltage of digit line 115-*a* may depend on its intrinsic capacitance. That is, as charge flows through digit line 115-*a*, some finite charge may be stored in digit line 115-*a* and the resulting voltage may depend on the intrinsic capacitance. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of picofarads (pF)). The resulting voltage of digit line 115-*a* may then be compared to a reference (e.g., a voltage of reference line 225) by sense component 125-*a* in order to determine the stored logic state in memory cell 105-*a*. Other sensing processes may be used.

In some examples, during a read operation, the voltage of digit line 115-*a* may be set to an initial sensing voltage (e.g., before memory cell 105 is coupled with digit line 115-*a*). When memory cell 105-*a* is subsequently coupled to digit line 115-*a*, the capacitor 205 of memory cell 105-*a* may begin to discharge onto digit line 115-*a*, thereby beginning signal development on digit line 115-*a*.

Sense component 125-*a* may include various transistors, capacitors, and amplifiers to detect and amplify a difference in signals. Sense component 125-*a* may include a sense amplifier that receives and compares the voltage of digit line 115-*a* and reference line 225, which may be set to a reference voltage. The sense amplifier output may be driven to the higher (e.g., a positive) or lower (e.g., negative or ground) supply voltage based on the comparison. For instance, if digit line 115-*a* has a higher voltage than reference line 225, then the sense amplifier output may be driven to a positive supply voltage. Sense component 125-*a* may include latch circuitry to latch the value of the memory cell.

In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., logic 1. Alternatively, if digit line 115-*a* has a lower voltage than reference line 225, the sense amplifier output may be driven to a negative or ground voltage. Sense component 125-*a* may similarly latch the sense amplifier output to determine the stored state in memory cell 105-*a*, e.g., logic 0. The latched logic state of memory cell 105-*a* may then be output, for example, through column decoder 130 as output 135 with reference to FIG. 1.

In some examples, the sense amplifier may include split capacitors that may be used to for various purposes during a read operation, including integration of charge from the memory cell. For example, the sense amplifier may include an integrator capacitor and a separate boost capacitor, along with associated switching components that may support independent coupling and decoupling of the integrator capacitor and/or the separate boost capacitor between the signal node and a voltage source. The split capacitors and associated switching components may be operable to provide different capacitances during different portions of a read operation. In another example, the sense amplifier may include an integrator capacitor and a separate displacement capacitor that may be coupled in series between the digit line and the signal node and that may be operable to provide different capacitances during different portions of a read operation.

In some cases, the sense amplifier may receive the voltage at a signal node coupled with the integrator capacitor in the sense component 125-*a* and compare the voltage of the signal node with the reference voltage. The sense amplifier output may be driven to the higher (e.g., a positive) or lower (e.g., negative or ground) supply voltage based on the comparison. In this case, the sense amplifier detects the value of the cell based on the voltage of the signal node rather than based on the voltage of a digit line, for example.

To write a value to a memory cell 105-*a*, a voltage may be applied across capacitor 205. Various methods may be used. In one example, selector device 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-*a*. The opposite process is performed to write a logic 1, where cell plate 230 is taken low and cell bottom 215 is taken high.

Figure 3:
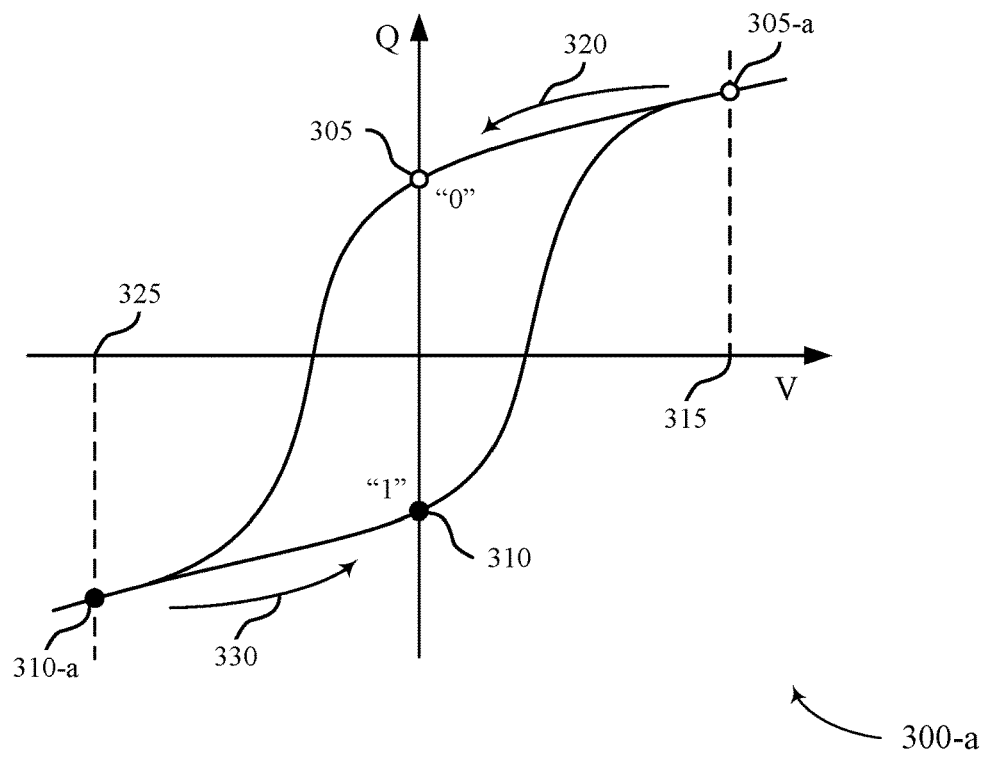
FIG. 3 illustrates an example of hysteresis curves that support techniques for reading a memory cell using a sense amplifier with split capacitors in accordance with aspects of the present disclosure.
Figure 3:
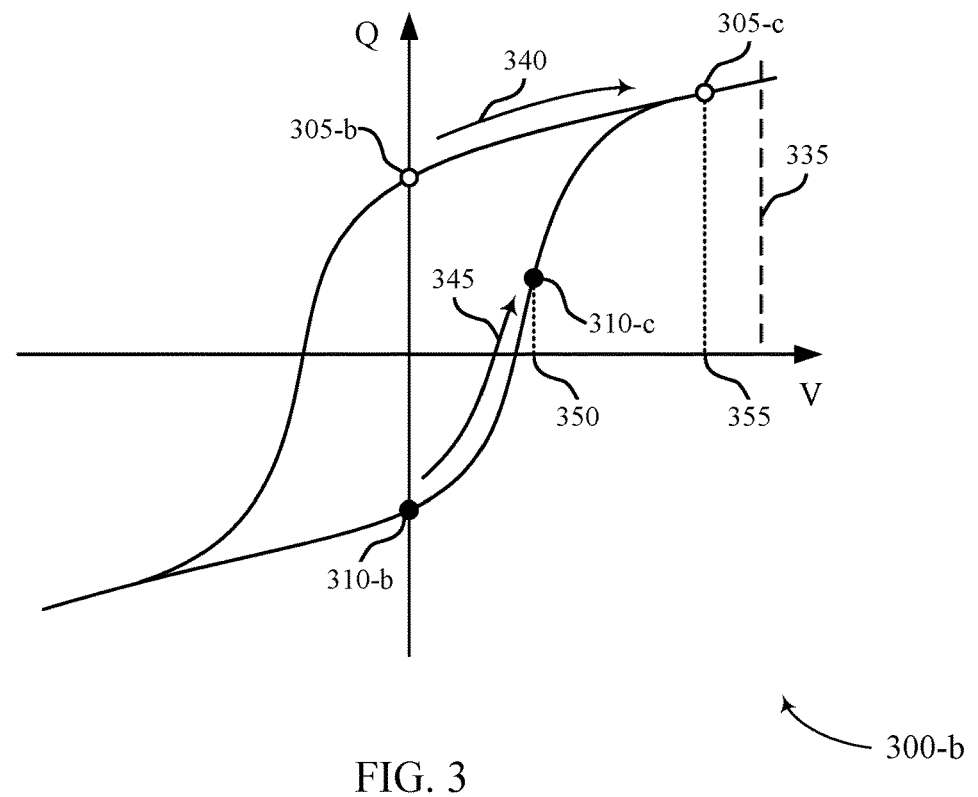

FIG. 3 illustrates an example of non-linear electrical properties with hysteresis curves 300-*a* and 300-*b* for a ferroelectric memory cell that supports techniques for reading a memory cell using a sense amplifier with split capacitors in accordance with aspects of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, e.g., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-*a* and 300-*b* may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)).

A negative voltage may be applied by maintaining the terminal in question at ground and applying a positive voltage to the second terminal—e.g., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-*a* and 300-*b*.

As depicted in hysteresis curve 300-*a*, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305-*a* and 310-*a* may also be referred to as the remnant polarization (Pr) values, e.g., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—e.g., the final stored charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not be equal to voltage 335 and instead may depend on the voltage of the digit line. The position of final charge states 305-*c* and 310-*c* on hysteresis curve 300-*b* may thus depend on the capacitance of the digit line and may be determined through a load-line analysis—e.g., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—e.g., (voltage 335–voltage 350) or (voltage 335–voltage 355). The reference voltage may be generated such that its magnitude is between the two possible voltages of the two possible digit line voltages in order to determine the stored logic state—e.g., if the digit line voltage is higher or lower than the reference voltage. For example, the reference voltage may be an average of the two quantities, (voltage 335–voltage 350) and (voltage 335–voltage 355). Upon comparison by the sense component, the sensed digit line voltage may be determined to be higher or lower than the reference voltage, and the stored logic value of the ferroelectric memory cell (e.g., a logic 0 or 1) may be determined.

In some cases, the displacement charge may be the charge that appears when the voltage applied across the memory cell increases. The displacement charge may represent the charge required to store or read a value of "1" on a memory cell. In some cases, the charge required to store or read a value of "1" may be less than the charge required to store or read a value of "0." For instance, with reference to the example of FIG. 3, the displacement charge for a ferroelectric memory cell may be represented as:

$$Q(disp)=|(Q(305\text{-}a)-Q(305)|$$

In some cases, the polar charge may be the charge that remains stored on the cell when the voltage across the cell is removed or decreases to essentially zero. The polar charge may represent the difference in charge required between storing or reading a value of "1" and storing a value of "0," and thus may represent the value stored on the memory cell. For instance, with reference to the example of FIG. 3, the polar charge for a ferroelectric memory cell may be represented as:

$$Q(polar)=|(Q(305)+Q(310)|$$

In some examples, as described in more detail with respect to FIGS. 4-13, a sense amplifier may include split capacitors (e.g., two separate capacitors that may be coupled with each other in parallel or in series) that may be used during a read operation to determine the stored logic value of the memory cell. In some examples, the split capacitors may provide a higher capacitance during certain portions of the read operation and a lower capacitance during other portions of the read operation.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction.

Figure 4:
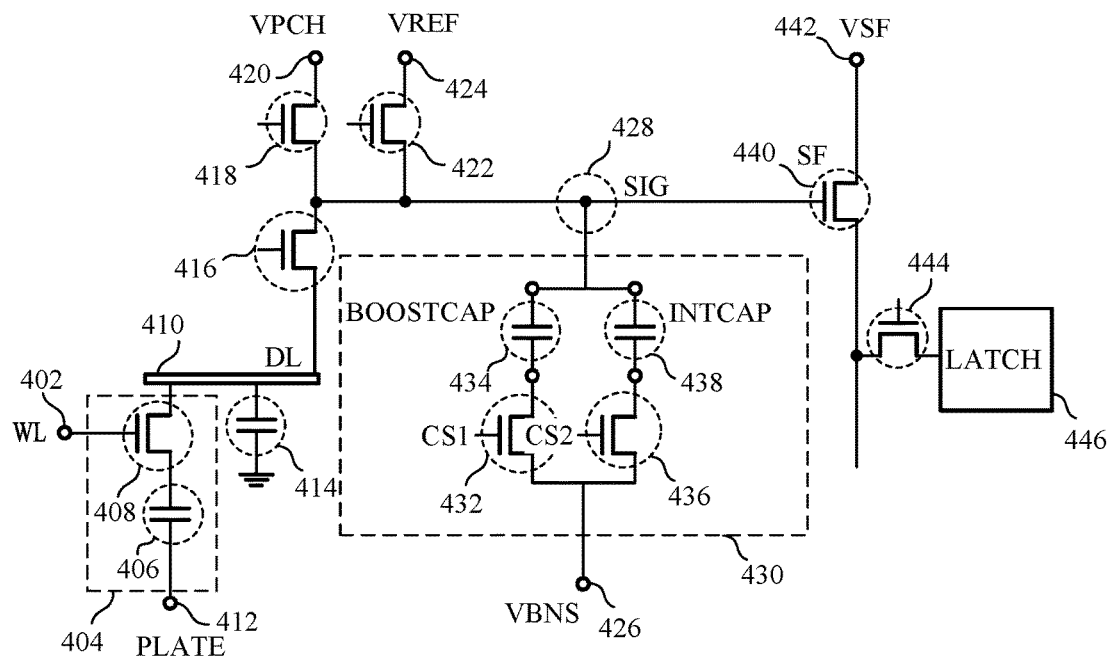
FIG. 4 illustrates an example of a circuit that supports techniques for reading a memory cell using a sense amplifier with split capacitors in accordance with aspects of the present disclosure.

FIG. 4 illustrates an example of a circuit 400 that supports techniques for reading a memory cell using a sense amplifier with split capacitors in accordance with aspects of the present disclosure. The circuit 400 illustrates a simplified circuit configuration that highlights several circuit components that work together during a read operation, as will be described in more detail with respect to FIGS. 5-7.

The circuit 400 includes a memory cell 404 and a digit line (DL) 410. The digit line 410 may be an example of the digit lines 115 described with reference to FIGS. 1 and 2. The memory cell 404 may be an example of the memory cells 105 described with reference to FIGS. 1 and 2. As described with reference to FIG. 1, digit line 410 may have or be associated with an intrinsic capacitance, represented in circuit 400 by capacitor 414.

The memory cell 404 may include a switching component 408 and a capacitor 406. In some cases, the capacitor 406 may be a ferroelectric capacitor, such as capacitor 205 described with reference to FIG. 2. The capacitor 406 may store a logic state (e.g., a logic state of 1 or 0). The switching component 408 may be an example of the selector device 220 described with reference to FIG. 2. In some cases, a plate of capacitor 406 is coupled with a plate line 412.

The memory cell 404 may be associated with a word line 402. The word line 402 may be an example of the word line 110 described with reference to FIGS. 1 and 2. During an access operation (e.g., a read operation or a write operation), the word line signal WL may be activated (e.g., asserted) on word line 402 to cause switching component 408 to couple the capacitor 406 with the digit line 410, thereby coupling memory cell 404 with digit line 410.

The digit line 410 may be selectively coupled with a signal node 428 (SIG) via switching component 416. Signal node 428 may, in turn, be selectively coupled with latch 446 via switching components 440, 444. Latch 446 may determine and latch a value stored on memory cell 404 based on a voltage of signal node 428. In some cases, latch 446 may determine the value based on a comparison of a voltage of signal node 428 with a reference voltage, as described with reference to FIG. 1.

Circuit 400 includes variable (e.g., configurable) capacitive component 430, which includes two split capacitors, boost capacitor 434 (BOOSTCAP) and integrator capacitor 438 (INTCAP), along with switching components 432, 436. Variable capacitive component 430 may be an alternative to or a substitute for a conventional amplifier capacitor, for example.

Boost capacitor 434 and/or integrator capacitor 438 may be capacitors having different capacitances or the same capacitances. In some cases, boost capacitor 434 may have a larger capacitance than integrator capacitor 438. Boost capacitor 434 may be so-named because it may be used for a boost operation during a read operation of the memory cell, as described herein. Integrator capacitor 438 may be so-named because it may be used along with an amplifier (e.g., a differential amplifier, not shown) to integrate charge transferred between memory cell 404 and integrator capacitor 438 during a read operation of memory cell 404.

In some cases, switching components 432, 436 may be independently activated or deactivated (e.g., selected or deselected) by activating or deactivating independent control signals CS1, CS2, respectively. In some cases, switching components 432, 436 may each be or include a transistor (e.g., a metal-oxide-semiconductor (MOS) transistor). A control signal CS1, CS2 may be provided to the gate of the respective transistor to activate the switching component 432, 436.

In the example of circuit 400, boost capacitor 434 is coupled with signal node 428 and is configured to be selectively coupled with a voltage source 426 via switching component 432. Integrator capacitor 438 is coupled with signal node 428 and is configured to be selectively coupled with voltage source 426 via switching component 436. Thus, boost capacitor 434 may be selectively coupled in parallel with integrator capacitor 438 such that a first node of boost capacitor 434 is coupled with a first node of integrator capacitor 438, and a second node of boost capacitor 434 is coupled with a second node of integrator capacitor 438. In some cases, the voltage of signal node 428 may be substantially equivalent to a voltage at a node of integrator capacitor 438 and/or boost capacitor 434.

In the example of circuit 400, boost capacitor 434 is configured to be coupled between signal node 428 and voltage source 426 independently of integrator capacitor 438, via switching component 432 and control signal CS1. Similarly, integrator capacitor 438 is configured to be coupled between signal node 428 and voltage source 426 independently of boost capacitor 434, via switching component 436 and control signal CS2.

The total capacitance of variable capacitive component 430 may depend on the state of switching components 432, 436; e.g., on whether each is activated (closed) or deactivated (open). For example, when both switching components 432, 436 are activated such that boost capacitor 434 is coupled between signal node 428 and voltage source 426 in parallel with integrator capacitor 438, the combined capacitance between signal node 428 and voltage source 426 due to variable capacitive component 430 may be expressed as the sum of the capacitances of boost capacitor 434 and integrator capacitor 438. When boost capacitor 434 is decoupled from voltage source 426 (e.g., switching component 432 is deactivated) and integrator capacitor 438 is coupled between signal node 428 and voltage source 426, the capacitance between signal node 428 and voltage source 426 due to variable capacitive component 430 may be the capacitance of integrator capacitor 438 and may not include the capacitance of boost capacitor 434.

Voltage source 426 may be referred to as a "boost and shift" voltage source (VBNS) since it may be used to adjust the voltage of signal node 428 during portions of a read operation by boosting (e.g., increasing) the voltage of signal node 428 and/or shifting (e.g., decreasing) the voltage of signal node 428.

In some cases, voltage source 426 may be used to increase the voltage of signal node 428 via variable capacitive component 430 (e.g., via boost capacitor 434 and/or integrator capacitor 438) during a first portion of a read operation.

Optionally, voltage source 426 may be used to shift the voltage of signal node 428 via variable capacitive component 430 (e.g., via boost capacitor 434 and/or integrator capacitor 438) during or after a second portion of a read operation. For example, voltage source 426 may be used to shift the voltage of signal node 428 down prior to latching the value stored on the memory cell 404 to enable the use of a low-voltage latch.

Circuit 400 includes additional voltage sources 420, 424, 442. Voltage source 420 (VPCH) may be used to pre-charge digit line 410 at the beginning of a read operation. Voltage source 424 (VREF) may be used to generate a reference voltage that may be used to determine a value stored on memory cell 404 during a read operation. Voltage source 442 (VSF) may be used to provide a voltage for switching component 440 when switching component 440 operates as a source follower (SF) during the read operation.

In some cases, switching components 408, 416, 418, 422, 432, 436, 440, and/or 444 may be or may include one or more transistors that may be used to couple various elements of circuit 400 by activating (e.g., asserting) a signal (e.g., WL, CS1, CS2) at a gate of the transistor(s). In some cases, switching component 416 may include two or more transistors in a cascode configuration. Switching component 440 may be a transistor that is configured to operate as a source follower (SF).

In some cases, it may be desirable for variable capacitive component 430 to provide a relatively large capacitance during the boost portion of the read operation (e.g., during the portion when voltage source 426 boosts the voltage of signal node 428). A large capacitance may be desirable to offset the effect of the intrinsic capacitance of digit line 410, as represented by capacitor 414, and provide a more efficient (e.g., faster) boost operation.

In some cases, a large capacitance may also be desirable during a displacement charge portion of the read operation, during which some or all of the displacement charge is transferred between the memory cell and the variable capacitive component after memory cell 404 is coupled with digit line 410 during the read operation. A large capacitance may be desirable to absorb (or provide) the displacement charge from (or to) memory cell 404 and ensure that the capacitor used for integrating the charge during signal development (e.g., during a portion of the read operation when the memory cell is coupled with the digit line) does not become saturated.

Thus, in some cases, variable capacitive component 430 may be configured with boost capacitor 434 coupled in parallel with integrator capacitor 438 during a first portion of the read operation, which may include the boost portion and/or the displacement charge portion.

In some cases, it may be desirable for variable capacitive component 430 to provide a relatively low (e.g., small, in terms of capacitance or microfarads) capacitance during a second portion of the read operation, when the polar charge is transferred between the memory cell and the variable capacitive component 430, after some or all of the displacement charge has been transferred. The polar charge may be an amount of charge that is less than the displacement charge, for example. During the second portion of the read operation, a smaller capacitance than during the first portion of the read operation may provide better accuracy for the read operation by providing a more faithful representation of the polar charge and thereby increasing the sense window, for example.

Thus, in some cases, variable capacitive component 430 may be configured with boost capacitor 434 decoupled from integrator capacitor 438 (e.g., decoupled from voltage source 426 by deactivating switching component 432) during the second portion of the read operation, such that the capacitance of variable capacitive component 430 is equal to the capacitance of integrator capacitor 438.

In some cases, the value of the memory cell 404 may be determined based on a voltage across integrator capacitor 438 after the signal development portion of the operation or based on a voltage of the signal node 428 (which may be substantially equivalent to the voltage of a node of the integrator capacitor 438 since the nodes are coupled).

The operation and interaction of the components depicted in circuit 400 is described in more detail with reference to the timing diagrams of FIGS. 5-7.

Figure 5:
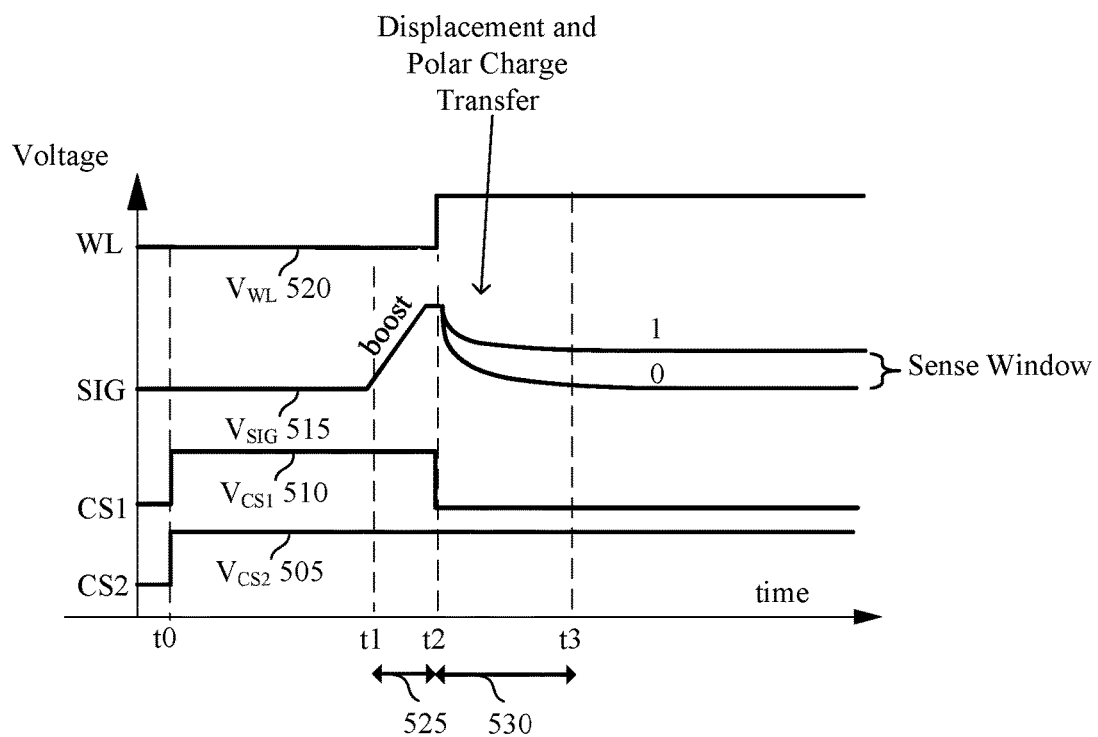
FIG. 5 illustrates an example of a timing diagram that supports techniques for reading a memory cell using a sense amplifier with split capacitors in accordance with aspects of the present disclosure.

FIG. 5 illustrates an example of a timing diagram 500 that supports reading a memory cell using a sense amplifier with split capacitors in accordance with aspects of the present disclosure. The timing diagram 500 shows various voltage levels associated with the components of the circuit 400 described with reference to FIG. 4 to illustrate how the techniques for reading a memory cell using a sense amplifier with split capacitors to provide a fast and reliable read operation.

Timing diagram 500 may correspond to operation of circuit 400 using what may be referred to as a "single boost" approach. The read operation may correspond to a time period between t0 and t3 that may include a boost portion and a signal development portion.

At time t0, control signals CS1, CS2 are activated (e.g., by increasing the voltage $V_{CS1}$ 510 and $V_{CS2}$ 505) to couple the boost capacitor (e.g., boost capacitor 434) and integrator capacitor (e.g., integrator capacitor 438) in parallel between the signal node (e.g., signal node 428) and a voltage source (e.g., voltage source 426). While control signals CS1 and CS2 are depicted as being activated substantially simultaneously in timing diagram 500, in some examples, they may be activated at different times occurring before time t1.

At time t1, the voltage of the voltage source (not shown) is increased to boost the voltage of the signal node $V_{SIG}$ 515 via the boost capacitor and the integrator capacitor; that is, increasing the voltage of the voltage source increases the voltages across the boost capacitor and the integrator capacitor, thereby increasing the voltage of the signal node $V_{SIG}$ 515, which is coupled with the boost capacitor and the integrator capacitor. The boost portion 525 of the read operation may occur between time t1 and time t2, while the boost capacitor and the integrator capacitor are coupled in parallel between the signal node and the voltage source. During the boost portion of the read operation, the capacitance of the variable capacitive component (e.g., variable capacitive component 430) is the sum of the capacitance of the boost capacitor and the integrator capacitor. Thus, during the boost portion of the read operation, the capacitance of the variable capacitive component is relatively large (e.g., as compared to the capacitance of the variable capacitive component during the subsequent signal development portion 530 of the read operation).

At time t2, the word line signal WL is asserted (e.g., by increasing the voltage of the word line, $V_{WL}$ 520) to couple the memory cell (e.g., memory cell 404) with the digit line (e.g., digit line 410). In some cases, at time t2, the digit line may already be coupled with the signal node via switching component 416; that is, switching component 416 may already be activated at time t2. The signal development portion 530 of the read operation may begin at time t2 when the word line signal is asserted.

Also at time t2 (or in some cases, shortly after time t2), control signal CS1 is deactivated to decouple the boost capacitor from the voltage source, and thereby decouple the boost capacitor from being coupled in parallel with the integrator capacitor. When the boost capacitor is decoupled, the capacitance of the variable capacitive component changes from being the sum of the capacitance of the boost capacitor and the integrator capacitor to being only the capacitance of the integrator capacitor.

In some examples, coupling the memory cell with the digit line cases charge to be transferred between the memory cell and the variable capacitive component (e.g., between the memory cell and the boost capacitor and/or the integrator capacitor, depending on the status of control signals CS1 and CS2) via the digit line and signal node. In the example of FIG. 5, coupling the memory cell with the digit line causes charge transfer between the memory cell and the integrator capacitor since CS1 is deactivated, and thus, the boost capacitor is decoupled from the integrator capacitor during the signal development portion of the read operation. The charge transfer causes a change (e.g., a decrease) in the signal node voltage $V_{SIG}$ 515. The charge transferred during the signal development portion of the read operation may include the displacement charge and some or all of the polar charge.

Thus, during the signal development portion 530 of the read operation, the capacitance of the variable capacitive component is equal to the capacitance of the integrator capacitor, and is smaller than the capacitance of the variable capacitive component during the boost portion 525 of the read operation.

The change in the signal node voltage $V_{SIG}$ may depend on the value stored on the memory cell at the beginning of the read operation; thus, FIG. 5 depicts two voltages that may be associated with reading a memory cell having a value of "1" or a value of "0." The difference in the two possible voltages of the signal node $V_{SIG}$ 515 (or in some cases, of the voltage across the integrator capacitor) after the signal development portion of the read operation (e.g., at time t3) may be referred to as the sense window; a larger sense window (e.g., a greater difference between the voltage associated with a "0" and the voltage associated with a "1") may be desirable, as it may enable a more accurate read operation. After the boost capacitor is decoupled at time t2, the capacitance of the variable capacitive component is relatively small, which may provide a larger sense window relative to the use of the larger capacitance used during the boost portion of the read operation.

At time t3, the sense component may determine and latch the value stored on the memory cell based on the voltage of the signal node $V_{SIG}$ 515. In some cases, the sense component may determine the value by comparing $V_{SIG}$ 515 with a reference voltage (not shown).

In some cases, the voltage of the signal node is substantially equivalent to the voltage of a node of the integrator capacitor because the integrator capacitor is coupled with the signal node. Thus, the sense component may determine the value based on the voltage of the signal node $V_{SIG}$ 515 and/or based on a voltage across the integrator capacitor.

Figure 6:
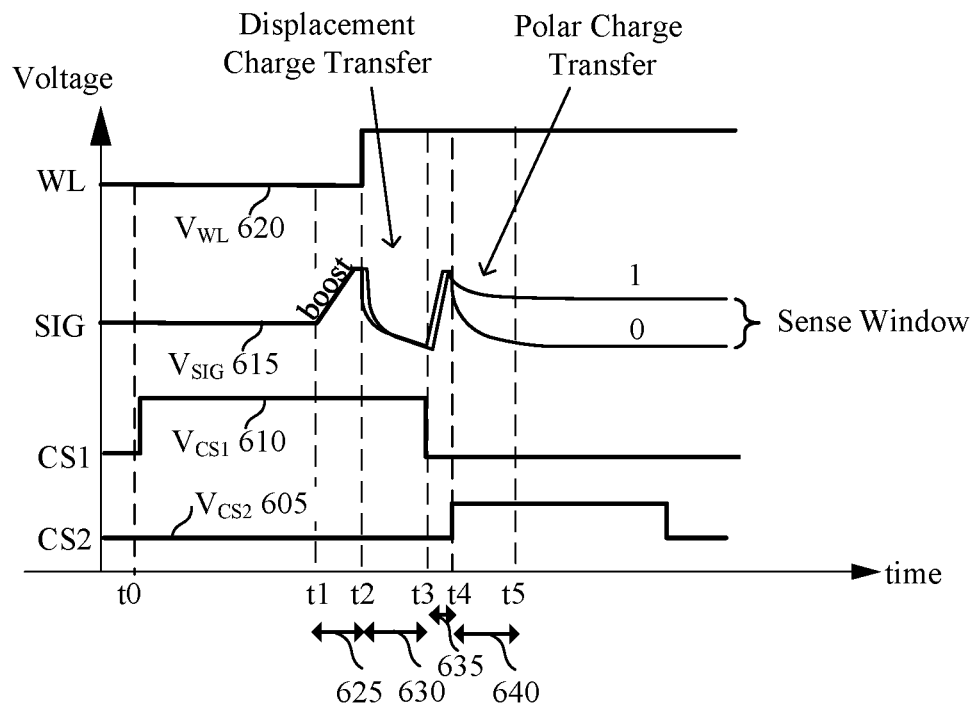
FIG. 6 illustrates an example of a timing diagram that supports techniques for reading a memory cell using a sense amplifier with split capacitors in accordance with aspects of the present disclosure.

FIG. 6 illustrates an example of a timing diagram 600 that supports reading a memory cell using a sense amplifier with split capacitors in accordance with aspects of the present disclosure. The timing diagram 600 shows various voltage levels associated with the components of the circuit 400 described with reference to FIG. 4 to illustrate how the techniques for reading a memory cell using a sense amplifier with split capacitors to provide a fast and reliable read operation.

Timing diagram 600 may correspond to operation of circuit 400 using what may be referred to as a "double boost" approach. The read operation may correspond to a time period between t0 and t5 that includes a first boost portion, a displacement charge portion, a second boost portion, and a polar charge portion.

At time t0, control signal CS1 is activated (e.g., by increasing the voltage $V_{CS1}$ 610) to couple the boost capacitor between the signal node (e.g., signal node 428) and a voltage source (e.g., voltage source 426). At time t0, the integrator capacitor is not coupled with the signal node since control signal CS2 is deactivated (e.g., the voltage $V_{CS2}$ 605 is low).

At time t1, the voltage of the voltage source (not shown) is increased to boost the voltage of the signal node $V_{SIG}$ 615 via the boost capacitor; that is, increasing the voltage of the voltage source increases the voltage across the boost capacitor, thereby increasing the voltage of the signal node, which is coupled with the boost capacitor. The first boost portion 625 of the read operation may occur between time t1 and time t2, while the boost capacitor is coupled between the signal node and the voltage source, and the integrator capacitor is uncoupled from the boost capacitor (e.g., control signal CS2 is deactivated). During the first boost portion of the read operation, the capacitance of the variable capacitive component (e.g., variable capacitive component 430) is substantially equal to the capacitance of the boost capacitor.

At time t2, the word line signal WL is asserted (e.g., by increasing the voltage of the word line, $V_{WL}$ 620) to couple the memory cell (e.g., memory cell 404) with the digit line (e.g., digit line 410). In some cases, at time t2, the digit line may already be coupled with the signal node via switching component 416; that is, switching component 416 may already be activated at time t2. The displacement charge portion 630 of the read operation may begin at time t2 when the word line signal is asserted to couple the memory cell with the digit line. In some cases, coupling the memory cell with the digit line causes charge transfer between the memory cell and the boost capacitor (e.g., via the signal node). From time t2 to t3, some or all of the displacement charge may be transferred between the memory cell and the boost capacitor.

At time t3, control signal CS1 is deactivated (e.g., by lowering the voltage $V_{CS1}$ 610) to decouple the boost capacitor from the voltage source. When the boost capacitor is decoupled, the capacitance of the variable capacitive component changes from being substantially equivalent to the capacitance of the boost capacitor to being substantially zero (since neither the boost capacitor nor the integrator capacitor are coupled between the signal node and the voltage source between t3 and t4). Thus, the voltage of the signal node $V_{SIG}$ 615 begins to rise due to charge sharing between the memory cell and the signal node. The period between time t3 and t4 may be referred to as the second boost portion 635 of the read operation.

In some cases, the time t3 at which the boost capacitor is decoupled from the voltage source is based on a fixed time delay relative to the time at which the word line signal is activated; e.g., relative to the time at which the memory cell is coupled with the digit line.

In some cases, the time t3 at which the boost capacitor is decoupled from the voltage source is based on a comparison of a voltage at a node of the boost capacitor with a voltage of the digit line. For example, the boost capacitor may be decoupled at a time when the voltage at a node of the boost capacitor is equal to the voltage of the digit line.

At time t4, control signal CS2 is activated to couple the integrator capacitor with the voltage source (e.g., by increasing the voltage $V_{CS2}$ 605 to activate switching component 436), and thereby couple the integrator capacitor between the signal node and the voltage source. Thus, at time t4, the capacitance of the variable capacitive component is substantially equivalent to the capacitance of the integrator capacitor. In some cases, coupling the integrator capacitor between the signal node and the voltage source causes charge transfer between the memory cell and the integrator capacitor. Beginning at time t4, some or all of the polar charge may be transferred between the memory cell and the integrator capacitor. The time period from t4-t5 may be referred to as the polar charge portion 640 of the read operation.

In some cases, the time t4 at which the integrator capacitor is coupled with the signal node is based on a fixed time delay after the time at which the boost capacitor is decoupled from the signal node; e.g., time t3.

At time t5, the sense component may determine and latch the value stored on the memory cell based on the voltage of the signal node $V_{SIG}$ 615 as described with respect to FIG. 5.

As previously discussed, the voltage of the signal node may be substantially equivalent to the voltage of a node of the integrator capacitor. Thus, the sense component may determine the value based on the voltage of the signal node $V_{SIG}$ 615 and/or based on a voltage across the integrator capacitor.

Figure 7:
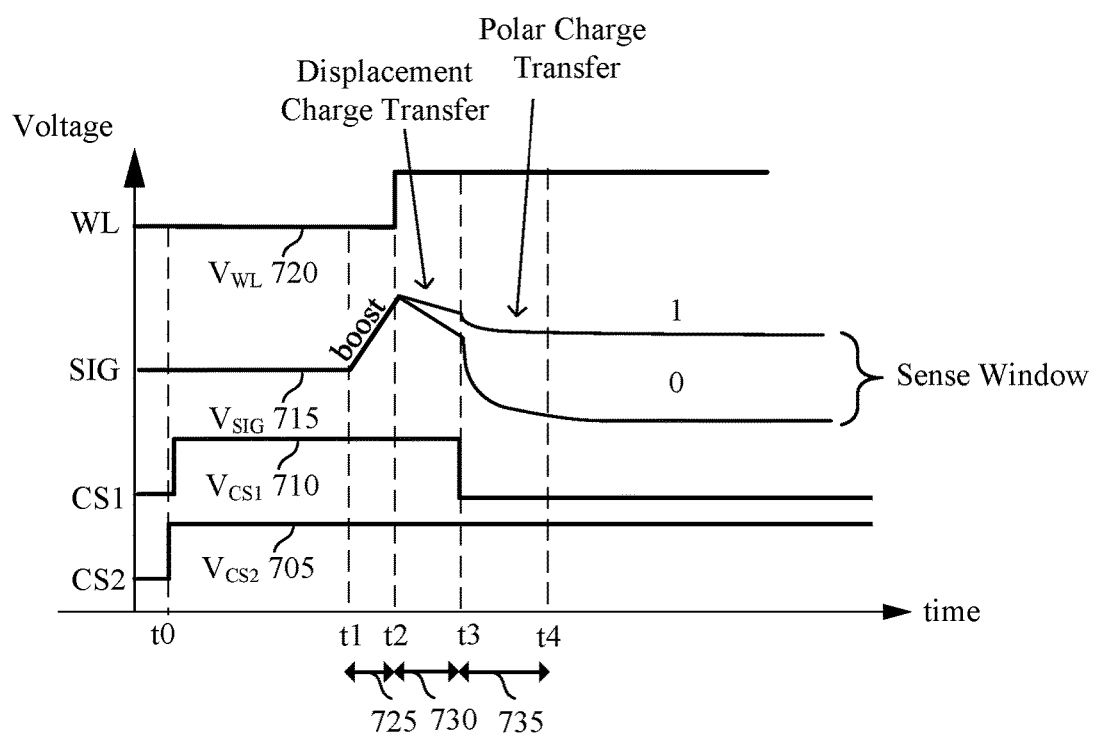
FIG. 7 illustrates an example of a timing diagram that supports techniques for reading a memory cell using a sense amplifier with split capacitors in accordance with aspects of the present disclosure.

FIG. 7 illustrates an example of a timing diagram 700 that supports reading a memory cell using a sense amplifier with split capacitors in accordance with aspects of the present disclosure. The timing diagram 700 illustrates various signals during a read operation using a sense amplifier with a variable capacitive component. The read operation may correspond to a time period between t0 and t4 that includes a first portion of the read operation and a second portion of the read operation. The timing diagram 700 shows various voltage levels associated with the components of the circuit 400 described with reference to FIG. 4 to illustrate how the techniques for reading a memory cell using a sense amplifier with a variable capacitive component to provide a fast and reliable read operation.

Timing diagram 700 may correspond to operation of circuit 400 using what may be referred to as a "non-linear capacitor" approach, because it may cause the variable capacitance component to provide a non-linear capacitance characteristic during a read operation. Compared to timing diagram 500, timing diagram 700 illustrates that control signal CS1, which couples the boost capacitor in parallel with the integrator capacitor between the signal node and the voltage source, remains active for a longer period of time after the word line signal $V_{WL}$ is asserted.

In this approach, the boost capacitor may be coupled in parallel with the integrator capacitor to provide a larger capacitance during displacement charge transfer and decoupled to provide a smaller capacitance during the polar charge transfer. Thus, a larger capacitance may be used for the boost portion and to absorb (or provide) some or all of the displacement charge, after which a smaller capacitance may be used to integrate the polar charge.

At time t0, control signals CS1, CS2 are activated (e.g., by increasing the voltage $V_{CS1}$ 705 and $V_{CS2}$ 710) to couple the boost capacitor and integrator capacitor in parallel between the signal node and a voltage source.

At time t1, the voltage source is increased to boost the voltage of the signal node $V_{SIG}$ 715 via the boost capacitor and the integrator capacitor. During this portion of the read operation, the capacitance of the variable capacitive component is relatively large, since the boost capacitor and the integrator capacitor are coupled in parallel. The time period between t1 and t2 may be referred to as the boost portion 725 of the read operation.

At time t2, the word line signal WL is asserted (e.g., by increasing the voltage of the word line, $V_{WL}$ 720) to couple the memory cell with the digit line. In some cases, at time t2, the digit line may already be coupled with the signal node via switching components. The time between t2 and t3 may be referred to as the displacement charge portion 730 of the read operation. In some examples, coupling the memory cell with the digit line may cause charge transfer between the memory cell and the variable capacitive component (e.g., between the memory cell and the boost capacitor and/or the integrator capacitor, depending on the status of control signals CS1 and CS2). During the displacement charge portion 730 of the read operation, some or all of the displacement charge is transferred between the memory cell and the variable capacitive component via the signal node. The charge transfer causes a change (e.g., a decrease) in the signal node voltage $V_{SIG}$ 715.

At time t3, control signal CS1 is deactivated (e.g., by lowering the voltage of $V_{CS1}$ 710) to decouple the boost capacitor from the voltage source, thereby decoupling the boost capacitor from being coupled in parallel with the integrator capacitor. Thus, at time t3, the capacitance of the variable capacitive component may be substantially equivalent to the capacitance of the integrator capacitor.

After time t3, charge continues to be transferred between the memory cell and the integrator capacitor. This charge may include the polar charge, and, in some cases, may include a portion of the displacement charge if the displacement charge was not fully transferred between the memory cell and the variable capacitive component before time t3. The time period between t3 and t4 may be referred to as the polar charge portion 735 of the read operation.

At time t4, after some or all of the polar charge has been transferred between the memory cell and the integrator capacitor, the sense component may determine and latch the value stored on the memory cell based on the voltage of the signal node $V_{SIG}$ 715 and/or the voltage across the integrator capacitor.

In some cases, the time at which the boost capacitor is decoupled, time t3, is based on a fixed delay (e.g., a fixed amount of elapsed time) relative to the time at which the word line signal $V_{WL}$ 720 is asserted; e.g., a fixed delay after coupling the memory cell with the digit line. In some cases, time t3 is based on an amount of charge accumulated on the boost capacitor; e.g., a time at which a certain amount of displacement charge has been accumulated on the boost capacitor. In some cases, time t3 is based on a time at which the boost capacitor is fully discharged; e.g., a time at which the boost capacitor may no longer transfer charge to the memory cell.

In some cases, the non-linear capacitor approach described with respect to timing diagram 700 may provide a better (e.g., larger) sense window relative to some other approaches since the voltage associated with a "1" value remains higher due to the relatively high capacitance of the variable capacitance component between t2 and t3 (during the displacement charge portion, in which the boost capacitor and integrator capacitor are coupled in parallel).

FIGS. 8A-8D depict exemplary variable capacitive components 830-a, 830-b, 830-c, 830-d that support reading a memory cell using a sense amplifier with split capacitors in accordance with aspects of the present disclosure. Variable capacitive components 830-a, 830-b, 830-c, 830-d may be examples of or alternatives to variable capacitive component 430 as depicted in FIG. 4.

Figure 8A:
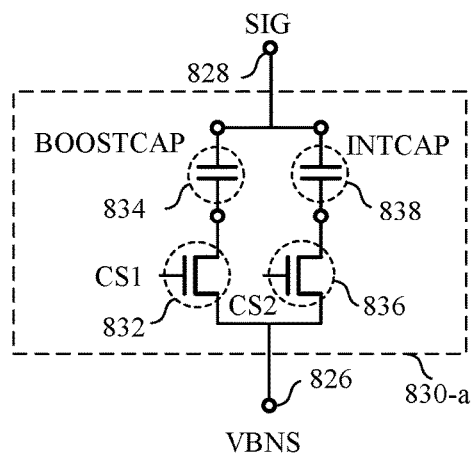
FIGS. 8A-8D illustrate examples of circuits that support techniques for reading a memory cell using a sense amplifier with split capacitors in accordance with aspects of the present disclosure.

FIG. 8A depicts variable capacitive component 830-a, which includes a boost capacitor 834, integrator capacitor 838, and switching components 832, 836 that may be controlled using control signals CS1 and CS2, respectively. In exemplary variable capacitive component 830-a, boost capacitor 834 and integrator capacitor 838 are configured to be independently coupled and decoupled with voltage source 826 via switching components 832 and 836. Because boost capacitor and integrator capacitor are both coupled with signal node 828, coupling boost capacitor 834 and integrator capacitor 838 with voltage source 826 couples boost capacitor 834 and integrator capacitor 838 in parallel between signal node 828 and voltage source 826. In some cases, switching components 832, 836 may be n-type transistors.

Figure 8B:
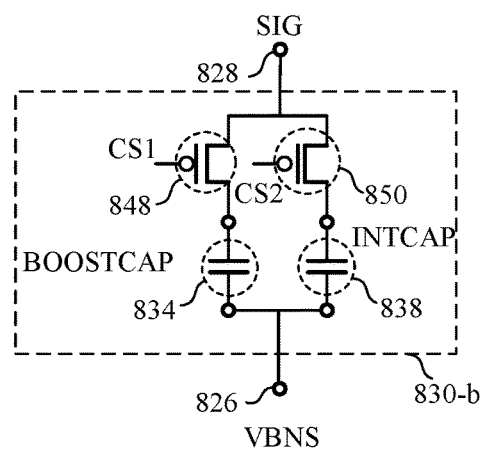

FIG. 8B depicts variable capacitive component 830-b, which may provide another alternative to variable capacitive component 430. In exemplary variable capacitive component 830-b, boost capacitor 834 and integrator capacitor 838 are configured to be independently coupled and decoupled with signal node 828 via switching components 848 and 850. Because boost capacitor and integrator capacitor are coupled with voltage source 826, coupling boost capacitor 834 and integrator capacitor 838 with signal node 828 (e.g., by activating CS1 and CS2) couples boost capacitor 834 and integrator capacitor 838 in parallel between signal node 828 and voltage source 826. In some cases, switching components 848, 850 may be p-type transistors.

Figure 8C:
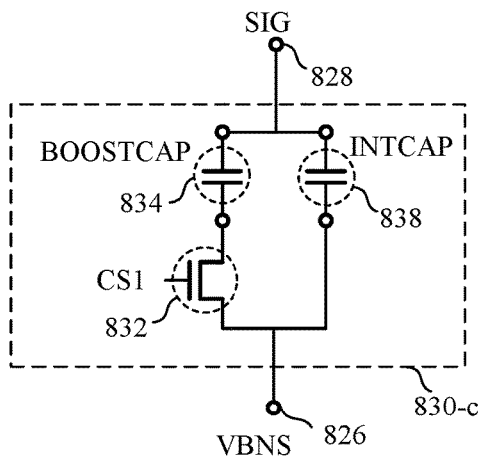

FIG. 8C depicts variable capacitive component 830-c, which may provide another alternative to variable capacitive component 430. Variable capacitive component 830-c provides an example of a variable capacitive component that requires a single switching component 832 and control signal (CS1). In variable capacitive component 830-c, integrator capacitor 838 is directly coupled (e.g., hardwired) between signal node 828 and voltage source 826 without a switching component. Thus, the operation of variable capacitive component 830-c may be similar to that described with respect to variable capacitive component 430 with control signal CS2 always activated. Boost capacitor 834 is configured to be independently coupled and decoupled with voltage source 826 via switching component 832. Because integrator capacitor is coupled with voltage source 826 and signal node 828, coupling boost capacitor 834 with voltage source 826 (e.g., by activating CS1) couples boost capacitor 834 and integrator capacitor 838 in parallel between signal node 828 and voltage source 826. In some cases, switching component 832 may be an n-type transistor.

Figure 8D:
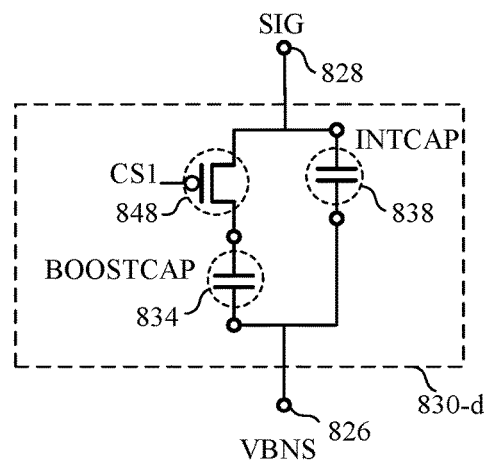

FIG. 8D depicts variable capacitive component 830-d, which may provide another alternative to variable capacitive component 430. Like variable capacitive component 830-c, variable capacitive component 830-d requires a single switching component 848 and control signal (CS1). In variable capacitive component 830-d, integrator capacitor 838 is coupled (e.g., hardwired) between signal node 828 and voltage source 826. Thus, the operation of variable capacitive component 830-c may be similar to that described with respect to variable capacitive component 430 with control signal CS2 always activated. Boost capacitor 834 is configured to be independently coupled and decoupled with signal node 828 via switching component 848. Because integrator capacitor is coupled with voltage source 826 and signal node 828, coupling boost capacitor 834 with signal node 828 (e.g., by activating CS1) couples boost capacitor 834 and integrator capacitor 838 in parallel between signal node 828 and voltage source 826. In some cases, switching component 848 may be a p-type transistor.

Figure 9:
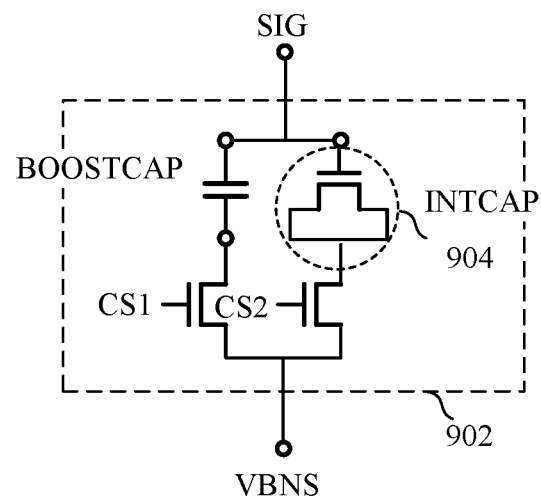
FIG. 9 illustrates an example of a circuit that supports techniques for reading a memory cell using a sense amplifier with split capacitors in accordance with aspects of the present disclosure.

FIG. 9 illustrates an example of a variable capacitive component 902 that supports reading a memory cell using a sense amplifier with split capacitors in accordance with certain aspects of the disclosure. Variable capacitive component 902 may be an alternative to variable capacitive component 430, for example, and may include non-linear integrator capacitor 904. Non-linear integrator capacitor 904 may be an MOS capacitor, the source and drain of which may be coupled together such that the gate capacitance of the MOS capacitor comprises a non-linear capacitor, which may be desirable because when the voltage across an MOS capacitor is lower than the threshold voltage, the capacitance of the non-linear capacitor decreases, thereby potentially providing a better sense window.

In some cases, non-linear integrator capacitor 904 may be substituted for integrator capacitor 838 in any one of the variable capacitive components 830 described with respect to FIG. 8. In some cases, the use of a non-linear integrator capacitor 904 may result in similar waveforms as depicted in timing diagram 700. In some cases, the use of a non-linear integrator capacitor 904 may enable similar or better performance (in terms of increasing the sense window) relative to that described with respect to the non-linear timing of timing diagram 700.

Figure 10:
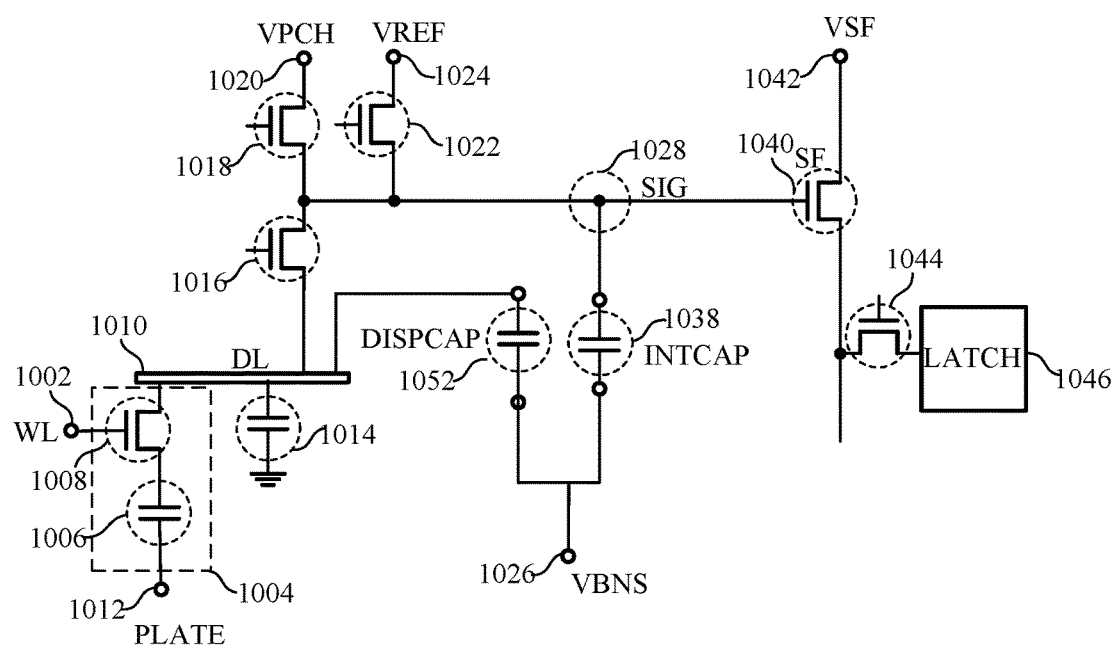
FIG. 10 illustrates an example of a circuit that supports techniques for reading a memory cell using a sense amplifier with split capacitors in accordance with aspects of the present disclosure.

FIG. 10 illustrates an example of a circuit 1000 that supports techniques for reading a memory cell using a sense amplifier with split capacitors in accordance with aspects of the present disclosure. Circuit 1000 illustrates a simplified circuit configuration that highlights several circuit components that work together during a read operation.

As previously discussed, in some cases, it may be desirable to have a relatively high (e.g., large, in terms of capacitance or microfarads) capacitance of an amplifier capacitor while the displacement charge is transferred between the memory cell and the amplifier capacitor, but it may be desirable to have a relatively small capacitance of an amplifier capacitor when the polar charge is transferred between the memory cell and the amplifier capacitor (e.g., after some or all of the displacement charge has been transferred between the amplifier capacitor and the memory cell). Circuit 1000 provides an example of using split capacitors to achieve both of these objectives. Circuit 1000 may be an alternative to circuit 400 and may provide similar benefits without the use of switching components (e.g., switching components 432, 436) and control signals (e.g., CS1, CS2) associated with the split capacitors.

The circuit 1000 includes a memory cell 1004 and a digit line (DL) 1010. The digit line 1010 may be an example of the digit lines 115 described with reference to FIGS. 1 and 2. The memory cell 1004 may be an example of the memory cells 105 described with reference to FIGS. 1 and 2. As described with reference to FIG. 1, digit line 1010 may have or be associated with an intrinsic capacitance, represented in circuit 1000 by capacitor 1014 (CDL).

The memory cell 1004 may include a switching component 1008 and a capacitor 1006. In some cases, the capacitor 1006 may be an example of a ferroelectric capacitor, such as capacitor 205 described with reference to FIG. 2. The capacitor 1006 may store a logic state (e.g., a logic state of 1 or 0). The switching component 1008 may be an example of the selector device 220 described with reference to FIG. 2.

The memory cell 1004 may be associated with a word line 1002. The word line 1002 may be an example of the word line 110 described with reference to FIGS. 1 and 2. During an access operation (e.g., a read operation or a write operation), the word line signal WL may be activated (e.g., asserted) on word line 1002 to cause switching component 1008 to couple the capacitor 1006 with the digit line 1010.

The digit line 1010 may be selectively coupled with a signal node 1028 (SIG) via switching component 1016. Signal node 1028 may, in turn, be selectively coupled with latch 1046 via switching components 1040, 1044. Latch 1046 may determine a value stored on memory cell 1004 based on a voltage of signal node 1028. In some cases, latch 1046 may determine the value based on a comparison of a voltage of signal node 1028 with a reference voltage, as described with reference to FIG. 1.

Circuit 1000 includes displacement capacitor 1052 (DISPCAP) and integrator capacitor 1038 (INTCAP). Displacement capacitor 1052 and integrator capacitor 1038 are coupled in series between digit line 1010 and signal node 1028. Displacement capacitor 1052 and integrator capacitor 1038 are also coupled with voltage source 1026. Displacement capacitor 1052 and integrator capacitor 1038 may be capacitors having different capacitances or the same capacitances. In some cases, displacement capacitor 1052 may have a larger capacitance than integrator capacitor 1038.

In some cases, the voltage of signal node 1028 may be equivalent to a voltage at a node of integrator capacitor 1038.

Voltage source 1026 may be used to adjust the voltage of signal node 1028 during portions of a read operation by boosting (e.g., increasing) the voltage of signal node 1028 and/or shifting (e.g., decreasing) the voltage of signal node 1028. In some cases, voltage source 1026 may be used to increase the voltage of signal node 1028 via integrator capacitor 1038 during a first portion of a read operation; e.g., during a boost portion of the read operation.

Optionally, voltage source 1026 may be used to shift the voltage of signal node 1028 via integrator capacitor 1038 during or after a second portion of a read operation. For example, voltage source 1026 may be used to shift the voltage of signal node 1028 down prior to latching the value stored on the memory cell to enable the use of a low-voltage latch.

Circuit 1000 includes additional voltage sources 1020, 1024, 1042. Voltage source 1020 (VPCH) may be used to pre-charge digit line 1010 at the beginning of a read operation. Voltage source 1024 (VREF) may be used to generate a reference voltage that may be used to determine a value stored on memory cell 1004 during a read operation. Voltage source 1042 (VSF) may be used to provide a voltage for switching component 1040 when switching component 1040 operates as a source follower.

In some cases, switching components 1008, 1016, 1018, 1022, 1040, and/or 1044 may be or may include one or more transistors that may be used to couple various elements of circuit 1000 by activating (e.g., asserting) a signal at a gate of the transistor(s). In some cases, switching component 1016 includes two or more transistors in a cascode configuration. Switching component 1040 may be a transistor that is configured to operate as a source follower (SF) between voltage source 1042 and latch 1046.

In the example of circuit 1000, displacement capacitor 1052 and digit line 1010 may be pre-charged to an initial voltage during a pre-charging portion of the read operation. During a subsequent boost portion of the read operation (e.g., when the voltage of voltage source 1026 is increased), the voltage of signal node 1028 is increased via integrator capacitor 1038, and the voltage of the digit line 1010 is increased via displacement capacitor 1052. Increasing the voltage of the digit line 1010 causes switching component 1016 to be deactivated since the voltage of the digit line 1010 is boosted higher than the threshold voltage of switching component 1016 and thus deactivates switching component 1016.

After the boost portion of the read operation (e.g., after switching component 1016 has been deactivated as described above), the word line signal WL may be activated on word line 1002 to couple the memory cell 1004 with the digit line 1010 and begin the signal development portion of the read operation. As previously discussed, the signal development portion includes a displacement charge portion during which the displacement charge is transferred between the memory cell and a capacitor(s), and a polar charge portion when the remaining polar charge is transferred between the memory cell and the capacitor(s).

In circuit 1000, once switching component 1016 is deactivated and memory cell 1004 is coupled with digit line 1010, memory cell 1004 may begin transferring the displacement charge between memory cell 1004 and displacement capacitor 1052 via digit line 1010. Thus, displacement capacitor 1052 may absorb or provide some or all of the displacement charge transferred between displacement capacitor 1052 and memory cell 1004. As the displacement charge is transferred between memory cell 1004 and displacement capacitor 1052, the voltage of the digit line 1010 may change, since the digit line 1010 is coupled with a node of the displacement capacitor 1052. In this manner, the voltage of the digit line 1010 may eventually return (decrease) to the pre-charge voltage. When the voltage of the digit line 1010 returns to the pre-charge voltage, this may cause switching component 1016 to be re-activated, thereby coupling the digit line 1010 with the signal node 1028. After switching component 1016 is reactivated, the polar charge may be integrated by integrator capacitor 1038 via digit line 1010 and signal node 1028. After the signal development portion of the read operation, latch 1046 may determine a value stored on memory cell 1004 based on the voltage of the signal node 1028 and/or on the voltage across integrator capacitor 1038.

Figure 11:
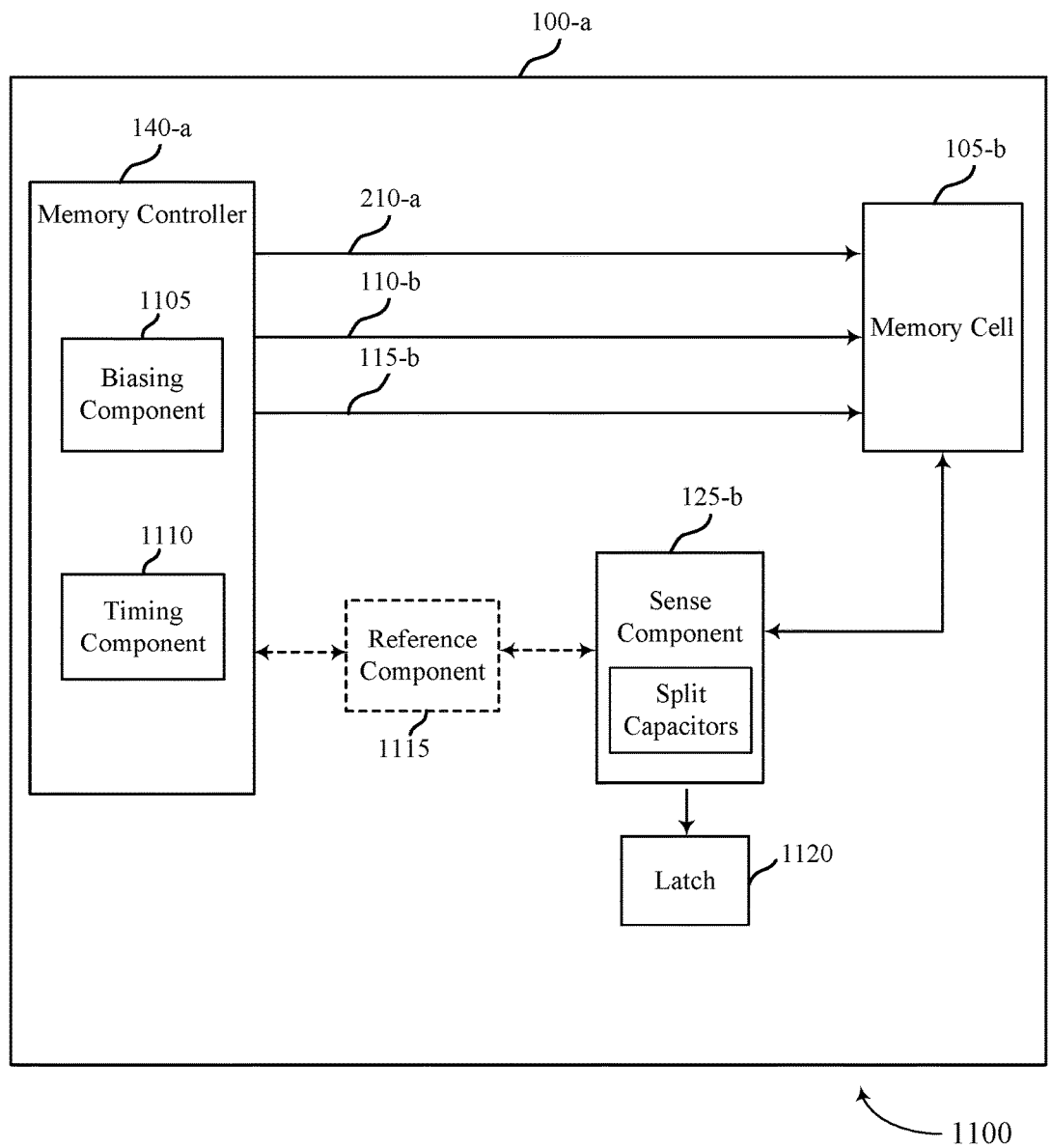
FIG. 11 illustrates a block diagram of a device that supports techniques for reading a memory cell using a sense amplifier with split capacitors in accordance with aspects of the present disclosure.

FIG. 11 shows a block diagram 1100 of a memory device that supports techniques for reading a memory cell using multi-stage memory sensing in accordance with aspects of the present disclosure. Memory array 100-*a* may be referred to as an electronic memory apparatus and includes memory controller 140-*a* and memory cell 105-*b*, which may be examples of memory controller 140 and memory cell 105 described with reference to FIG. 1. Memory controller 140-*a* may include a biasing component 1105 and a timing component 1110 and may operate memory array 100-*a* as described with reference to FIG. 1. Memory controller 140-*a* may be in electronic communication with word line 110-*b*, digit line 115-*b*, plate line 210-*a*, and sense component 125-*b*, which may be examples of word line 110, digit line 115, plate line 210, and sense component 125 described with reference to FIGS. 1 and 2. Memory array 100-*a* may also include reference component 1115 and latch 1120. The components of memory array 100-*a* may be in electronic communication with each other and may perform the functions described with reference to FIGS. 1 through 3. In some cases, the sense component 125-*b*, reference component 1115, and/or the latch 1120 may be components of memory controller 140-*a*.

Memory controller 140-*a* may be configured to assert a signal(s) on one or more of word line 110-*b*, plate line 210-*a*, or digit line 115-*b* by applying voltages to those various nodes. For example, the biasing component 1105 may be configured to apply a voltage to operate memory cell 105-*b* to read or write memory cell 105-*b* as described above. In some cases, memory controller 140-*a* may include a row decoder, column decoder, or both, as described with reference to FIG. 1. This may enable the memory controller 140-*a* to access one or more memory cells 105. The biasing component 1105 may also provide voltage potentials to the reference component 1115 in order to generate a reference signal for sense component 125-*b*. Additionally, the biasing component 1105 may provide voltage potentials for the operation of the sense component 125-*b*. In some examples, the memory controller 140-*a* may control various phases of a read operation. In some cases, the memory controller 140-*a* may assert a control signal(s) to activate a transistor(s) to couple an amplifier capacitor with a digit line 115-*b*. Memory controller 140-*a* may also assert a signal on word line 110-*b* to couple a memory cell 105-*b* to a digit line 115-*b*.

In some cases, the memory controller 140-*a* may perform its operations using the timing component 1110. For example, the timing component 1110 may control the timing of the various word line selections, digit line selections, or plate line biasing, including timing for switching and voltage application to perform the memory functions, such as reading and writing, discussed herein. In some cases, the timing component 1110 may control the operations of the biasing component 1105. In some cases, the timing component 1110 may control the timing of asserting or deasserting control signals (e.g., CS1, CS2) to activate or deactivate one or more switching components.

In some cases, the memory array 100-*a* may include the reference component 1115. The reference component 1115 may include various components to generate a reference signal for the sense component 125-*b*. The reference component 1115 may include circuitry configured to produce reference signals. In some cases, the reference component 1115 may include other ferroelectric memory cells 105. In some examples, the reference component 1115 may be configured to output a voltage with a value between the two sense voltages, as described with reference to FIG. 3. Or the reference component 1115 may be designed to output a virtual ground voltage (e.g., approximately 0V).

The sense component 125-*b* may compare a signal from memory cell 105-*b* (e.g., through digit line 115-*b*, as integrated on an integrator capacitor) with a reference signal (e.g., a reference signal from the reference component 1115). The value may be latched by latch 1120, where it may be used in accordance with the operations of an electronic device of which memory array 100-*a* is a part. While latch 1120 is depicted as being external to sense component 125-*b*, in some cases, latch 1120 may be included in sense component 125-*b* or memory controller 140-*a*.

In some examples, the sense component may include split capacitors. In some examples, the sense component may include a variable capacitive component as described with respect to FIGS. 4-9. In some examples, the sense component may include a displacement capacitor and an integrator capacitor as described with respect to FIG. 10.

Figure 12:
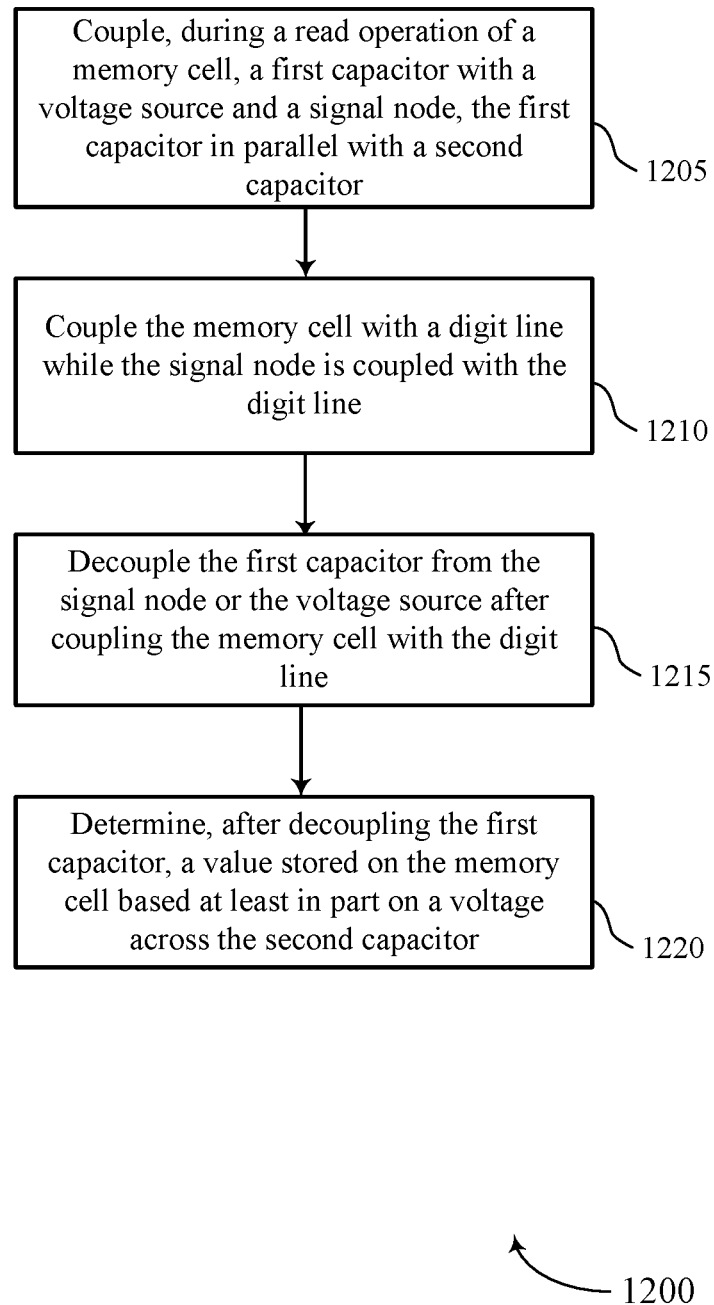
FIGS. 12, 13, and 14 illustrate a method or methods for reading a memory cell using a sense amplifier with split capacitors in accordance with aspects of the present disclosure.

FIG. 12 shows a flowchart illustrating a method 1200 that supports system level timing budget improvements in accordance with aspects of the present disclosure. The operations of method 1200 may be implemented by a memory system (e.g., memory system 1000) or its components as described herein. For example, some operations of method 1200 may be performed by a memory controller (e.g., memory controller 140) as described with reference to FIGS. 1 and 11. In some examples, a processor may execute a set of instructions to control the functional elements of the memory controller or other aspects of a memory device or system that includes the memory device to perform some of the functions described below. Additionally or alternatively, a memory system may perform aspects of the functions described below using special-purpose hardware.

At 1205, the method may include coupling, during a read operation of a memory cell, a first capacitor (e.g., boost capacitor 434, 834) with a voltage source (e.g., voltage source 426, 826) and a signal node (e.g., signal node 428), the first capacitor in parallel with a second capacitor (e.g., integrator capacitor 438, 838). In some examples, when the first capacitor is coupled with the voltage source and the signal node, it is coupled in parallel with the second capacitor. In some examples, the first capacitor may be coupled with the voltage source and the signal node by activating a switching component (e.g., switching component 432, 832, 848). In some examples, the switching component may be activated by activating a control signal (e.g., CS1). In some examples, aspects of the operations of 1205 may be performed as described with reference to FIGS. 1-9.

At 1210, the method may include coupling the memory cell with a digit line (e.g., digit line 115, 410) while the signal node is coupled with the digit line. In some examples, the memory cell may be coupled with the digit line by activating a word line signal (WL) on a word line (e.g., word line 110, 402) associated with the memory cell. In some examples, aspects of the operations of 1210 may be performed as described with reference to FIGS. 1-9.

At 1215, the method may include decoupling the first capacitor from the signal node or the voltage source after coupling the memory cell with the digit line. In some examples, the first capacitor may be decoupled from the signal node or the voltage source by deactivating a switching component (e.g., switching component 432, 832, 848). In some examples, aspects of the operations of 1210 may be performed as described with reference to FIGS. 1-9.

At 1220, the method may include determining, after decoupling the first capacitor, a value stored on the memory cell based at least in part on a voltage across the second capacitor. In some examples, the value stored on the memory cell may be determined by a latch (e.g., latch 446, 1120). In some examples, aspects of the operations of 1220 may be performed as described with reference to FIGS. 1-9.

In some examples, an apparatus may perform a method or methods as described herein, such as the method 1200, using general- or special-purpose hardware. The apparatus may include features, means, or instructions for coupling, during a read operation of a memory cell, a first capacitor with a voltage source and a signal node, the first capacitor in parallel with a second capacitor; coupling the memory cell with a digit line while the signal node is coupled with the digit line; decoupling the first capacitor from the signal node or the voltage source after coupling the memory cell with the digit line; and determining, after decoupling the first capacitor, a value stored on the memory cell based at least in part on a voltage across the second capacitor. In some examples, coupling the first capacitor comprises activating a first switching component to couple the first capacitor with the voltage source or the signal node. In some examples, decoupling the first capacitor occurs based at least in part on a fixed delay after coupling the memory cell with the digit line. In some examples, decoupling the first capacitor occurs based at least in part on an amount of charge accumulated on the first capacitor. In some examples, decoupling the first capacitor occurs based at least in part on the first capacitor becoming fully discharged. In some examples, a node of the second capacitor is coupled with the signal node and coupling the memory cell with the digit line causes charge transfer between the second capacitor and the memory cell. In some examples, the second capacitor has a lower capacitance than the first capacitor. In some examples, the second capacitor is a non-linear capacitor.

Some examples of the method 1200 and apparatuses described herein may further include processes, features, means, or instructions for activating a second switching component to couple the second capacitor with the voltage source or the signal node.

Some examples of the method 1200 and apparatuses described herein may further include processes, features, means, or instructions for increasing a voltage of the voltage source to increase a voltage of the signal node via the first capacitor before coupling the memory cell with the digit line.

Some examples of the method 1200 and apparatuses described herein may further include processes, features, means, or instructions for decreasing a voltage of the voltage source to decrease a voltage of the signal node via the second capacitor before determining the value.

Figure 13:
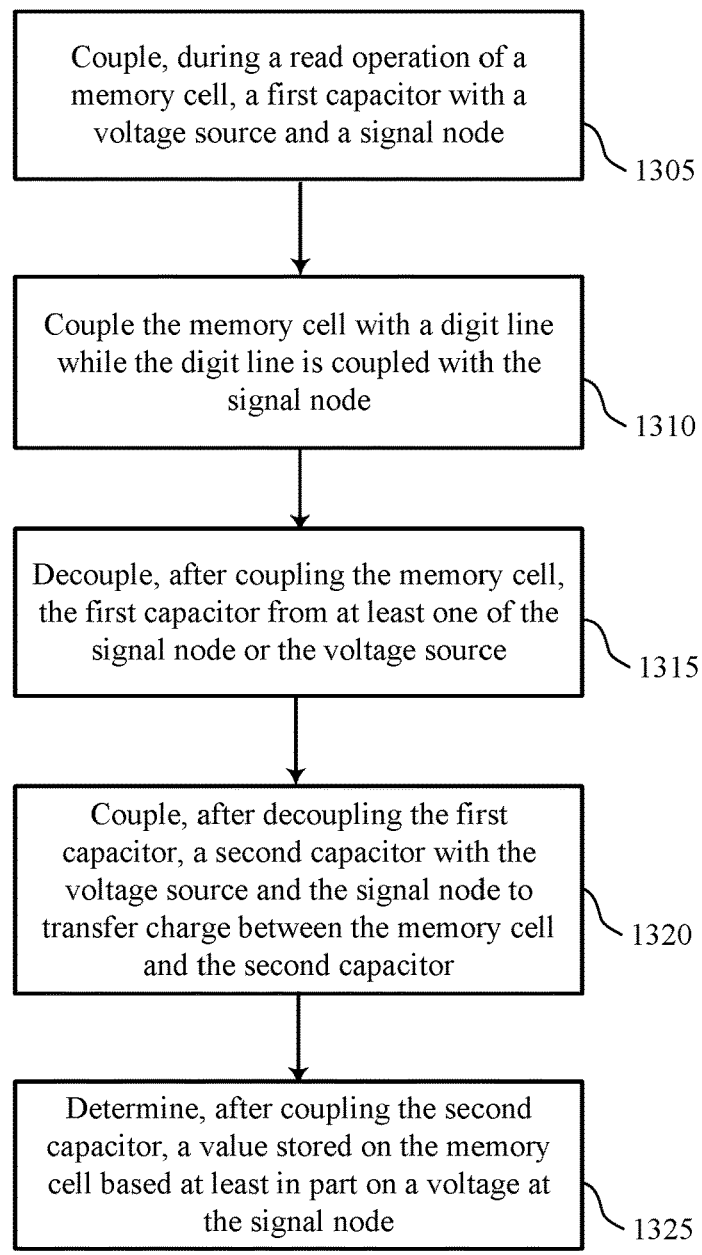

FIG. 13 shows a flowchart illustrating a method 1300 that supports system level timing budget improvements in accordance with aspects of the present disclosure. The operations of method 1300 may be implemented by a memory system (e.g., memory system 1000) or its components as described herein. For example, some operations of method 1300 may be performed by a memory controller (e.g., memory controller 140) as described with reference to FIGS. 1-2. In some examples, a processor may execute a set of instructions to control the functional elements of the memory controller or other aspects of a memory device or system that includes the memory device to perform some of the functions described below. Additionally or alternatively, a memory system may perform aspects of the functions described below using special-purpose hardware.

At 1305, the method may include coupling, during a read operation of a memory cell, a first capacitor (e.g., boost capacitor 434) with a voltage source (e.g., voltage source 426) and a signal node (e.g., signal node 428), the first capacitor in parallel with a second capacitor (e.g., integrator capacitor 438). In some examples, when the first capacitor is coupled with the voltage source and the signal node, it is coupled in parallel with a second capacitor. In some examples, the first capacitor may be coupled with the voltage source and the signal node by activating a switching component (e.g., switching component 432 or 848). In some examples, the switching component may be activated by activating a control signal (e.g., CS1). In some examples, aspects of the operations of 1305 may be performed as described with reference to FIGS. 1-9.

At 1310, the method may include coupling the memory cell with a digit line (e.g., digit line 410) while the signal node is coupled with the digit line. In some examples, the memory cell may be coupled with the digit line by activating a word line signal (WL) on a word line (e.g., word line 402) associated with the memory cell. In some examples, coupling the memory cell with the digit line causes charge transfer between the memory cell and the first capacitor. In some cases, the transferred charge may be some or all of the displacement charge. In some examples, aspects of the operations of 1310 may be performed as described with reference to FIGS. 1-9.

At 1315, the method may include decoupling the first capacitor from the signal node or the voltage source after coupling the memory cell with the digit line. In some examples, the first capacitor may be decoupled from the signal node by deactivating a switching component (e.g., switching component 432 or switching component 736). In some examples, aspects of the operations of 1315 may be performed as described with reference to FIGS. 1-9.

At 1320, the method may include coupling, after decoupling the first capacitor, a second capacitor (e.g., integrator capacitor 438) with the voltage source and the signal node to transfer charge between the memory cell and the second capacitor. In some cases, the transferred charge may be some or all of the polar charge. In some cases, the transferred charge may include a portion of the displacement charge. In some examples, aspects of the operations of 1320 may be performed as described with reference to FIGS. 1-9.

At 1325, the method may include determining, after coupling the second capacitor, a value stored on the memory cell based at least in part on a voltage at the signal node. In some cases, the value may be determined by a latch (e.g., latch 446, 1120). In some examples, aspects of the operations of 1325 may be performed as described with reference to FIGS. 1-9.

In some examples, an apparatus may perform a method or methods as described herein, such as the method 1300, using general- or special-purpose hardware. The apparatus may include features, means, or instructions for coupling, during a read operation of a memory cell, a first capacitor with a voltage source and a signal node; coupling the memory cell with a digit line while the digit line is coupled with the signal node; decoupling, after coupling the memory cell, the first capacitor from at least one of the signal node or the voltage source; coupling, after decoupling the first capacitor, a second capacitor with the voltage source and the signal node to transfer charge between the memory cell and the second capacitor; and determining, after coupling the second capacitor, a value stored on the memory cell based at least in part on a voltage at the signal node. In some examples, coupling the first capacitor includes activating a first switching component to couple the first capacitor with the voltage source or the signal node. In some examples, coupling the second capacitor includes activating a second switching component to couple the second capacitor with the voltage source or the signal node. In some examples, the first capacitor is decoupled based at least in part on a comparison of a voltage at a node of the first capacitor and a voltage of the digit line. In some examples, the second capacitor is coupled based at least in part on a fixed time delay after the first capacitor is decoupled. In some examples, the node of the second capacitor is coupled with the signal node, and wherein the voltage of the signal node depends at least in part on an amount of charge transferred between the memory cell and the second capacitor.

Some examples of the method 1300 and apparatuses described herein may further include processes, features, means, or instructions for increasing a voltage of the voltage source to increase a voltage of the signal node via the first capacitor before coupling the memory cell with the digit line.

Figure 14:
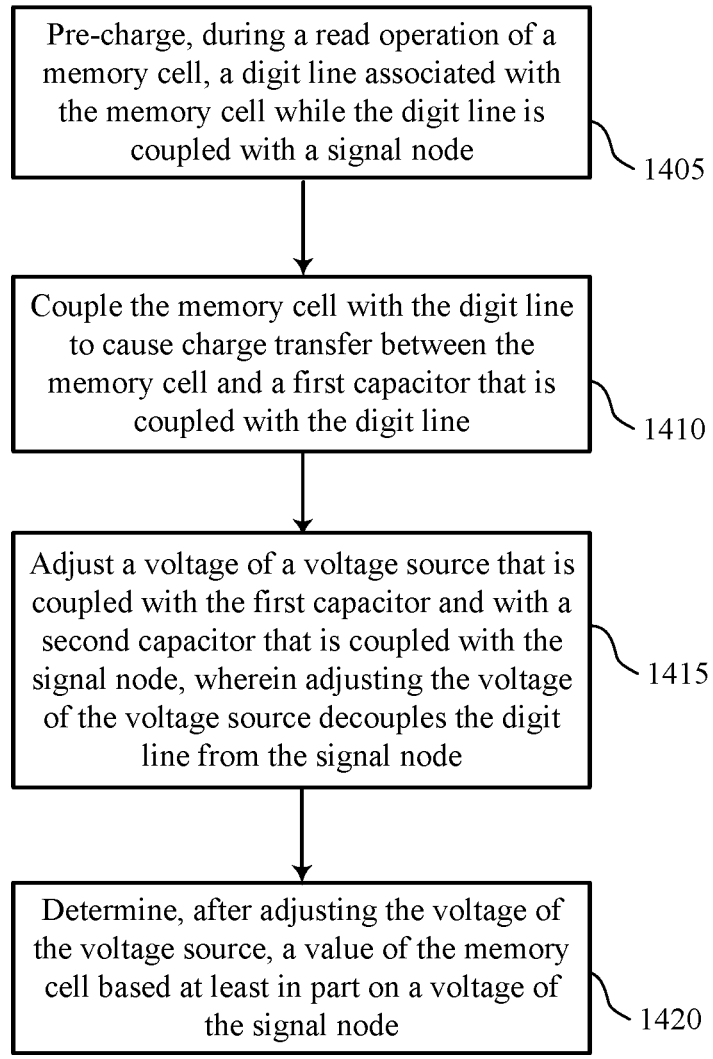

FIG. 14 shows a flowchart illustrating a method 1400 that supports system level timing budget improvements in accordance with aspects of the present disclosure. The operations of method 1400 may be implemented by a memory system (e.g., memory system 1000) or its components as described herein. For example, some operations of method 1400 may be performed by a memory controller (e.g., memory controller 140) as described with reference to FIGS. 1-2. In some examples, a processor may execute a set of instructions to control the functional elements of the memory controller or other aspects of a memory device or system that includes the memory device to perform some of the functions described below. Additionally or alternatively, a memory system may perform aspects of the functions described below using special-purpose hardware.

At 1405, the method may include pre-charging, during a read operation of a memory cell (e.g., memory cell 1004), a digit line (e.g., digit line 1010) associated with the memory cell while the digit line is coupled with a signal node (e.g., signal node 1028). In some examples, pre-charging the digit line includes coupling a pre-charge voltage source (e.g., pre-charge voltage source 1020) with the digit line. In some examples, pre-charging the digit line includes pre-charging a first capacitor (e.g., displacement capacitor 1052) that is coupled with the digit line. In some examples, aspects of the operations of 1405 may be performed as described with reference to FIG. 10.

At 1410, the method may include coupling the memory cell with the digit line to cause charge transfer (e.g., a transfer of some or all of the displacement charge) between the memory cell and the first capacitor that is coupled with the digit line. In some cases, charge may be transferred from the first capacitor to the memory cell. In some cases, charge may be transferred from the memory cell to the first capacitor. In some examples the memory cell is coupled with the digit line by activating a word line signal (WL) on a word line (e.g., word line 1002) associated with the memory cell. In some examples, aspects of the operations of 1410 may be performed as described with reference to FIG. 10.

At 1415, the method may include adjusting a voltage of a voltage source (e.g., voltage source 1026) that is coupled with the first capacitor and with a second capacitor (e.g., integrator capacitor 1038) that is coupled with the signal node, wherein adjusting the voltage of the voltage source decouples the digit line from the signal node. In some examples, adjusting the voltage source includes increasing the voltage of the voltage source. In some examples, increasing the voltage of the voltage source increases the voltage of the digit line via the first capacitor, which decouples the digit line from the signal node by deactivating a switching component (e.g., switching component 1016). In some examples, aspects of the operations of 1415 may be performed as described with reference to FIG. 10.

At 1420, the method may include determining, after adjusting the voltage of the voltage source, a value of the memory cell based at least in part on a voltage of the signal node. In some examples, the value of the memory cell is determined by a latch (e.g., latch 1046, 1120). In some examples, aspects of the operations of 1420 may be performed as described with reference to FIG. 10.

In some examples, an apparatus may perform a method or methods as described herein, such as the method 1400, using general- or special-purpose hardware. The apparatus may include features, means, or instructions for pre-charging, during a read operation of a memory cell, a digit line associated with the memory cell while the digit line is coupled with a signal node; coupling the memory cell with the digit line to cause charge transfer between the memory cell and a first capacitor that is coupled with the digit line; adjusting a voltage of a voltage source that is coupled with the first capacitor and with a second capacitor that is coupled with the signal node. In some cases, adjusting the voltage of the voltage source decouples the digit line from the signal node. The method may further include determining, after adjusting the voltage of the voltage source, a value of the memory cell based at least in part on a voltage of the signal node. In some examples, coupling the memory cell with the digit line causes charge transfer between the memory cell and the second capacitor. In some examples, the voltage source is a first voltage source and pre-charging the digit line includes coupling a second voltage source with the digit line and the first capacitor. In some examples, adjusting the voltage of the digit line decouples the digit line from the signal node at least in part by causing a switching component coupled with the digit line to become deactivated.

It should be noted that the methods described (e.g., methods 1200, 1300, 1400) above describe possible implementations, and that the operations and the steps may be rearranged or otherwise modified and that other implementations are possible. Further, aspects of two or more of the methods may be combined.

In some examples, a memory device may perform aspects of the functions described herein. The memory device may include a memory cell; a signal node configured to be selectively coupled with a digit line of a memory cell during a read operation of the memory cell; a capacitive component coupled with a voltage source and the signal node, the capacitive component configured to provide a higher capacitance during a first portion of the read operation and a lower capacitance during a second portion of the read operation; and a latch coupled with the signal node and configured to determine a value stored on the memory cell based at least in part on a voltage of the signal node after the second portion of the read operation. In some examples, the capacitive component includes a first capacitor configured to be selectively coupled with the voltage source and the signal node; and a second capacitor coupled with the voltage source and the signal node. The first capacitor is configured to be selectively coupled with the voltage source and the signal node independent of the second capacitor. In some examples, the first capacitor and the second capacitor are configured to be coupled in parallel between the voltage source and the signal node during the first portion of the read operation, and the first capacitor is configured to be decoupled from the second capacitor during the second portion of the read operation. In some examples, the second capacitor is configured to be selectively coupled between the voltage source and the signal node. In some examples, coupling the memory cell with the digit line causes charge transfer between the memory cell and the second capacitor via the signal node. In some examples, the second capacitor has a lower capacitance than the first capacitor.

Some examples of the memory device further include a controller configured to activate a first switching component to couple, during the first portion of the read operation, the first capacitor between the voltage source and the signal node in parallel with the second capacitor; activate a word line signal to couple the memory cell with the digit line, deactivate the first switching component to decouple, during the second portion of the read operation, the first capacitor from the second capacitor; and activate the latch to determine the value stored on the memory cell after the second portion of the read operation. In some examples, the controller is configured to increase a voltage of the voltage source to increase the voltage of the signal node via the capacitive component before activating the word line signal. In some examples, coupling the memory cell with the digit line causes a second amount of charge to be transferred between the memory cell and the second capacitor.

Some examples of the memory device further include a second switching component, wherein the second capacitor is configured to be coupled with the signal node and the voltage source via activation of the second switching component, and wherein the controller is further configured to activate the second switching component before activating the word line signal.

In some examples, a memory device may perform aspects of the functions described herein. The memory device may include a memory cell; a digit line associated with the memory cell; a signal node configured to be selectively coupled with the digit line; a first capacitor coupled with the digit line and a voltage source; a second capacitor coupled with the voltage source and the signal node, the second capacitor coupled in series with the first capacitor; and a latch coupled with the signal node and configured to determine a value stored on the memory cell based at least in part on a voltage of the signal node.

Some examples of the memory device further include a controller configured to, during a read operation of the memory cell: pre-charge the digit line; couple the memory cell with the digit line; increase the voltage of the voltage source to adjust the voltage of the digit line via the first capacitor, wherein increasing voltage of the voltage source causes a first amount of charge to be transferred between the memory cell and the first capacitor via the digit line, and causes the digit line to be decoupled from the signal node; and activate the latch to determine the value of the memory cell.

Some examples of the memory device further include a switching component configured to couple the digit line with the signal node, wherein: increasing the voltage of the voltage source causes the switching component to be deactivated.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of electrons between the components. Components are considered in electronic communication with (or in conductive contact with or connected with or coupled with) one another if there is any conductive path between the components that can, at any time, support the flow of electrons between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of electrons between the connected components may be interrupted for a time, for example, using one or more intermediate components such as switches or transistors.

The term "coupling" refers to condition of moving from an open-circuit relationship between components in which electrons are not presently capable of flowing between the components over a conductive path to a closed-circuit relationship between components in which electronic are capable of flowing between components over the conductive path. When a component, such as a controller, couples other components together, the component initiates a change that allows electrons to flow between the other components over a conductive path that previously did not permit electrons to flow.

As used herein, the term "substantially" means that the modified characteristic (e.g., a verb or adjective modified by the term substantially) need not be absolute but is close enough so as to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and include a three terminal device including a source, drain, and gate. The terminals may be connected to other electronic elements through conductive materials, e.g., metals. The source and drain may be conductive and may include a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
coupling, during a read operation of a memory cell, a first capacitor with a voltage source and a signal node, the first capacitor in parallel with a second capacitor;
increasing a voltage of the voltage source to increase a voltage of the signal node via the first capacitor;
coupling, after increasing the voltage of the voltage source, the memory cell with a digit line while the signal node is coupled with the digit line;
decoupling the first capacitor from the signal node or the voltage source after coupling the memory cell with the digit line; and
determining, after decoupling the first capacitor, a value stored on the memory cell based at least in part on a voltage across the second capacitor.

2. The method of claim 1, wherein coupling the first capacitor comprises:
activating a first switching component to couple the first capacitor with the voltage source or the signal node.

3. The method of claim 1, further comprising:
activating a second switching component to couple the second capacitor with the voltage source or the signal node.

4. The method of claim 1, wherein decoupling the first capacitor occurs based at least in part on a fixed delay after coupling the memory cell with the digit line.

5. The method of claim 1, wherein decoupling the first capacitor occurs based at least in part on an amount of charge accumulated on the first capacitor.

6. The method of claim 5, wherein decoupling the first capacitor occurs based at least in part on the first capacitor becoming fully discharged.

7. The method of claim 1, wherein a node of the second capacitor is coupled with the signal node, and wherein coupling the memory cell with the digit line causes charge transfer between the second capacitor and the memory cell.

8. The method of claim 1, wherein the second capacitor has a lower capacitance than the first capacitor.

9. The method of claim 1, wherein the second capacitor is a non-linear capacitor.

10. A method, comprising:
coupling, during a read operation of a memory cell, a first capacitor with a voltage source and a signal node, the first capacitor in parallel with a second capacitor;
coupling the memory cell with a digit line while the signal node is coupled with the digit line;
decoupling the first capacitor from the signal node or the voltage source after coupling the memory cell with the digit line;
decreasing a voltage of the voltage source to decrease a voltage of the signal node via the second capacitor; and
determining, after decoupling the first capacitor and decreasing the voltage of the voltage source, a value stored on the memory cell based at least in part on a voltage across the second capacitor.

11. The method of claim 10, wherein coupling the first capacitor comprises:
activating a first switching component to couple the first capacitor with the voltage source or the signal node.

12. The method of claim 10, further comprising:
activating a second switching component to couple the second capacitor with the voltage source or the signal node.

13. The method of claim 10, wherein decoupling the first capacitor occurs based at least in part on a fixed delay after coupling the memory cell with the digit line.

14. A method, comprising:
coupling, during a read operation of a memory cell, a first capacitor with a voltage source and a signal node;
increasing a voltage of the voltage source to increase a voltage of the signal node via the first capacitor;
coupling, after increasing the voltage of the voltage source, the memory cell with a digit line while the digit line is coupled with the signal node;
decoupling, after coupling the memory cell, the first capacitor from at least one of the signal node or the voltage source;
coupling, after decoupling the first capacitor, a second capacitor with the voltage source and the signal node to transfer charge between the memory cell and the second capacitor; and
determining, after coupling the second capacitor, a value stored on the memory cell based at least in part on a voltage at the signal node.

15. The method of claim 14, wherein coupling the first capacitor comprises:
activating a first switching component to couple the first capacitor with the voltage source or the signal node.

16. The method of claim 14, wherein coupling the second capacitor comprises:
activating a second switching component to couple the second capacitor with the voltage source or the signal node.

17. The method of claim 14, wherein the first capacitor is decoupled based at least in part on a comparison of a voltage at a node of the first capacitor and a voltage of the digit line.

18. The method of claim 14, wherein the second capacitor is coupled based at least in part on a fixed time delay after the first capacitor is decoupled.

19. The method of claim 14, wherein a node of the second capacitor is coupled with the signal node, and wherein the voltage of the signal node depends at least in part on an amount of charge transferred between the memory cell and the second capacitor.

20. A method, comprising:
pre-charging, during a read operation of a memory cell, a digit line associated with the memory cell while the digit line is coupled with a signal node;
coupling the memory cell with the digit line to cause charge transfer between the memory cell and a first capacitor that is coupled with the digit line;
adjusting a voltage of a voltage source that is coupled with the first capacitor and with a second capacitor that is coupled with the signal node, wherein adjusting the voltage of the voltage sources decouples the digit line from the signal node; and
determining, after adjusting the voltage of the voltage source, a value of the memory cell based at least in part on a voltage of the signal node.

21. The method of claim 20, wherein coupling the memory cell with the digit line causes charge transfer between the memory cell and the second capacitor.

22. The method of claim 20, wherein the voltage source is a first voltage source and wherein pre-charging the digit line comprises:
coupling a second voltage source with the digit line and the first capacitor.

23. The method of claim 20, wherein:
adjusting the voltage of the digit line decouples the digit line from the signal node at least in part by causing a switching component coupled with the digit line to become deactivated.

24. A memory device, comprising:
a memory cell;
a signal node configured to be selectively coupled with a digit line of the memory cell during a read operation of the memory cell;
a capacitive component coupled with a voltage source and the signal node, the capacitive component configured to provide a higher capacitance during a first portion of the read operation and a lower capacitance during a second portion of the read operation, wherein the capacitive component comprises:
  a first capacitor configured to be selectively coupled with the voltage source and the signal node; and
  a second capacitor coupled with the voltage source and the signal node, wherein the first capacitor is configured to be selectively coupled with the voltage source and the signal node independent of the second capacitor;
a latch coupled with the signal node and configured to determine a value stored on the memory cell based at least in part on a voltage of the signal node after the second portion of the read operation; and
a controller configured to:
  activate a first switching component to couple, during the first portion of the read operation, the first capacitor between the voltage source and the signal node in parallel with the second capacitor;
  increase a voltage of the voltage source to increase the voltage of the signal node via the capacitive component;
  activate, after increasing the voltage of the voltage source, a word line signal to couple the memory cell with the digit line;
  deactivate the first switching component to decouple, during the second portion of the read operation, the first capacitor from the second capacitor; and
  activate the latch to determine the value stored on the memory cell after the second portion of the read operation.

25. The memory device of claim 24, wherein the first capacitor and the second capacitor are configured to be coupled in parallel between the voltage source and the signal node during the first portion of the read operation, and wherein the first capacitor is configured to be decoupled from the second capacitor during the second portion of the read operation.

26. The memory device of claim 24, wherein the second capacitor is configured to be selectively coupled between the voltage source and the signal node.

27. The memory device of claim 24, wherein coupling the memory cell with the digit line causes charge transfer between the memory cell and the second capacitor via the signal node.

28. The memory device of claim 24, wherein the second capacitor has a lower capacitance than the first capacitor.

29. A memory device, comprising:
a memory cell;
a signal node configured to be selectively coupled with the digit line of the memory cell during a read operation of the memory cell;
a capacitive component coupled with a voltage source and the signal node, the capacitive component configured to provide a higher capacitance during a first portion of the read operation and a lower capacitance during a second portion of the read operation, wherein the capacitive component comprises:
  a first capacitor configured to be selectively coupled with the voltage source and the signal node; and
  a second capacitor coupled with the voltage source and the signal node, wherein the first capacitor is configured to be selectively coupled with the voltage source and the signal node independent of the second capacitor;
a latch coupled with the signal node and configured to determine a value stored on the memory cell based at least in part on a voltage of the signal node after the second portion of the read operation; and
a controller configured to:
  activate a first switching component to couple, during the first portion of the read operation, the first capacitor between the voltage source and the signal node in parallel with the second capacitor;
  activate a word line signal to couple the memory cell with a digit line;
  deactivate the first switching component to decouple, during the second portion of the read operation, the first capacitor from the second capacitor; and
  activate the latch to determine the value stored on the memory cell after the second portion of the read operation; and
a second switching component, wherein the second capacitor is configured to be coupled with the signal node and the voltage source via activation of the second switching component, and wherein the controller is further configured to activate the second switching component before activating the word line signal.

30. The memory device of claim 29, wherein the first capacitor and the second capacitor are configured to be coupled in parallel between the voltage source and the signal node during the first portion of the read operation, and wherein the first capacitor is configured to be decoupled from the second capacitor during the second portion of the read operation.

31. The memory device of claim 29, wherein the second capacitor is configured to be selectively coupled between the voltage source and the signal node.

32. A memory device, comprising:
a memory cell;
a digit line associated with the memory cell;
a signal node configured to be selectively coupled with the digit line;
a first capacitor coupled with the digit line and a voltage source;
a second capacitor coupled with the voltage source and the signal node;
a latch coupled with the signal node and configured to determine a value stored on the memory cell based at least in part on a voltage of the signal node; and
a switching component configured to couple the digit line with the signal node, wherein increasing the voltage of the voltage source causes the switching component to be deactivated.

33. The memory device of claim 32, wherein:
coupling the memory cell with the digit line causes a second amount of charge to be transferred between the memory cell and the second capacitor.

34. A memory device, comprising:
a memory cell;
a digit line associated with the memory cell;

a signal node configured to be selectively coupled with the digit line;

a first capacitor coupled with the digit line and a voltage source;

a second capacitor coupled with the voltage source and the signal node;

a latch coupled with the signal node and configured to determine a value stored on the memory cell based at least in part on a voltage of the signal node; and a controller configured to, during a read operation of the memory cell:

pre-charge the digit line;

couple the memory cell with the digit line;

increase the voltage of the voltage source to adjust the voltage of the digit line via the first capacitor, wherein increasing voltage of the voltage source causes a first amount of charge to be transferred between the memory cell and the first capacitor via the digit line, and causes the digit line to be decoupled from the signal node; and activate the latch to determine the value of the memory cell.

35. The memory device of claim 34, wherein:

coupling the memory cell with the digit line causes a second amount of charge to be transferred between the memory cell and the second capacitor.

* * * * *